(12) United States Patent
Muramoto

(10) Patent No.: US 11,961,757 B2
(45) Date of Patent: Apr. 16, 2024

(54) SUBSTRATE HOLDING APPARATUS AND SUBSTRATE PROCESSING APPARATUS

(71) Applicant: SCREEN Holdings Co., Ltd., Kyoto (JP)

(72) Inventor: Ryo Muramoto, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 731 days.

(21) Appl. No.: 16/639,413

(22) PCT Filed: Aug. 1, 2018

(86) PCT No.: PCT/JP2018/028768
§ 371 (c)(1),
(2) Date: Feb. 14, 2020

(87) PCT Pub. No.: WO2019/058774
PCT Pub. Date: Mar. 28, 2019

(65) Prior Publication Data
US 2021/0134652 A1    May 6, 2021

(30) Foreign Application Priority Data
Sep. 22, 2017  (JP) .................................. 2017-182461

(51) Int. Cl.
*H01L 21/687* (2006.01)
*H01L 21/67* (2006.01)

(52) U.S. Cl.
CPC .. *H01L 21/68764* (2013.01); *H01L 21/67017* (2013.01); *H01L 21/67023* (2013.01);
(Continued)

(58) Field of Classification Search
None
See application file for complete search history.

(56) References Cited

U.S. PATENT DOCUMENTS 5,211,753 A * 5/1993 Swain ..................... G03F 7/162
118/52
5,906,860 A   5/1999 Motoda et al.
(Continued)

FOREIGN PATENT DOCUMENTS

JP    2003174010 A  *  6/2003
JP    2005-235945 A     9/2005
(Continued)

OTHER PUBLICATIONS

English translation of JP 2003174010.*
(Continued)

*Primary Examiner* — Charles Capozzi
(74) *Attorney, Agent, or Firm* — OSTROLENK FABER LLP

(57) ABSTRACT

A substrate holding apparatus is used for a substrate processing apparatus for supplying the processing liquid to a substrate. The substrate holding apparatus includes a holding member, a ring member, and a rotation mechanism. The holding member holds the substrate in a horizontal attitude. The ring member is in a shape of a ring surrounding a peripheral edge of the substrate held by the holding member, and has an upper surface level with or positioned below a front surface of the substrate. The rotation mechanism rotates the holding member and the ring member about a rotation axis at rotation speeds different from each other and/or in rotational directions different from each other, the rotation axis being a vertical axis passing through the substrate held by the holding member.

16 Claims, 17 Drawing Sheets

(52) U.S. Cl.
CPC .... *H01L 21/67051* (2013.01); *H01L 21/6708* (2013.01); *H01L 21/68735* (2013.01); *H01L 21/68757* (2013.01); *H01L 21/68785* (2013.01); *H01L 21/68792* (2013.01)

(56) References Cited

U.S. PATENT DOCUMENTS

| | | | |
|---|---|---|---|
| 2004/0211959 A1* | 10/2004 | Kajita | H01L 21/67051 257/48 |
| 2005/0072266 A1* | 4/2005 | Zaech | H01L 21/68764 74/640 |
| 2008/0070418 A1* | 3/2008 | Miyagi | H01L 21/67051 257/E21.486 |
| 2011/0203734 A1 | 8/2011 | Koji | 156/345.24 |
| 2015/0037499 A1 | 2/2015 | Breingan et al. | 427/240 |

FOREIGN PATENT DOCUMENTS

| | | |
|---|---|---|
| JP | 2011-212753 A | 10/2011 |
| JP | 2011-216520 A | 10/2011 |
| KR | 10-1997-0072021 A | 11/1997 |

OTHER PUBLICATIONS

Notice of Decision to Grant dated Mar. 27, 2021 in corresponding Korean Patent Application No. 10-2020-7004029.
International Search Report dated Oct. 30, 2018 in corresponding PCT International Application No. PCT/JP2018/028768.
Written Opinion dated Oct. 30, 2018 in corresponding PCT International Application No. PCT/JP2018/028768.
Office Action dated May 29, 2019 in corresponding Taiwanese Patent Application No. 107125744, along with a partial English translation based on a Japanese translation.

* cited by examiner

SUBSTRATE HOLDING APPARATUS AND SUBSTRATE PROCESSING APPARATUS

CROSS-REFERENCE TO RELATED APPLICATIONS

The present application is a 35 U.S.C. §§ 371 national phase conversion of International Application No. PCT/JP2018/028768, filed Aug. 1, 2018, which claims priority to Japanese Patent Application No. 2017-182461, filed Sep. 22, 2017, the contents of both of which are incorporated herein by reference. The PCT International Application was published in the Japanese language.

TECHNICAL FIELD

The present invention relates to a substrate holding apparatus and a substrate processing apparatus and, more particularly, to a substrate processing apparatus which supplies a processing liquid to a substrate and a substrate holding apparatus for use in the same.

BACKGROUND ART

A substrate processing apparatus which supplies a processing liquid such as a chemical liquid for etching and a rinsing liquid for cleaning to a substrate such as a semiconductor substrate while rotating the substrate in a horizontal plane has been hitherto proposed (for example, Patent Document 1).

In Patent Document 1, for example, the substrate processing apparatus includes a wafer holding part, a nozzle, and a rotary cup. The wafer holding part includes a horizontally provided disk-shaped rotary plate and a member protruding from an upper surface of the rotary plate to hold a peripheral edge of a substrate. The rotary plate is rotated by a motor. The substrate held by the wafer holding part accordingly rotates.

The nozzle ejects a processing liquid toward a surface of the substrate. The rotary cup is disposed on the rotary plate. More specifically, the rotary cup is disposed on an outer peripheral region of the rotary plate. This rotary cup includes an overhang part for covering the outer peripheral region of the rotary plate, a tubular outside wall part extending vertically from an outer peripheral edge portion of the overhang part and surrounding the rotary plate from outside, and a guide member provided between the overhang part and the wafer holding part. A spacer for the formation of a plurality of openings for passage of the processing liquid therethrough is provided between the guide member and the overhang part and between the guide member and the wafer holding part.

In this substrate processing apparatus, the processing liquid from the nozzle is supplied to the substrate while the wafer holding part is rotated. As the substrate rotates, the processing liquid spreads and passes through the aforementioned openings. Then, the processing liquid flies off from an outer peripheral edge of the rotary plate to the outside wall part of the rotary cup. The processing liquid acts on the entire surface of the substrate because the processing liquid flows over the entire surface of the substrate. In the case where the processing liquid is, for example, a chemical liquid for etching, the surface of the substrate is etched as appropriate.

PRIOR ART DOCUMENTS

Patent Documents

Patent Document 1: Japanese Patent Application Laid-Open No. 2011-212753

SUMMARY

Problem to be Solved by the Invention

The rotation speed of the wafer holding part is set to a value suitable for the processing liquid to act on the substrate. When the rotation speed is high, the velocity (flow velocity) of the processing liquid flying off to the outside wall part of the rotary cup is high. In this case, the processing liquid splashed back from the outside wall part of the rotary cup can adhere again to the substrate side. The processing liquid adhering again to the substrate becomes a factor responsible for the generation of particles on the substrate.

When the rotation speed is low, on the other hand, the flow velocity of the processing liquid flowing over the outer peripheral region of the rotary plate is low. In this case, there is a danger that the processing liquid forms puddles between the rotary plate and the overhang part.

It is therefore an object of the present invention to provide a substrate holding apparatus and a substrate processing apparatus which are capable of adjusting the flow velocity of the processing liquid flying outwardly.

Means to Solve the Problem

To solve the aforementioned problem, a first aspect of a substrate holding apparatus according to the present invention is intended for a substrate holding apparatus for use in a substrate processing apparatus for supplying a processing liquid to a substrate. The substrate holding apparatus comprises: a holding member holding a substrate in a horizontal attitude; a ring member in a shape of a ring surrounding a peripheral edge of the substrate held by the holding member as seen in plan view, the ring member having an upper surface level with or positioned below a front surface of the substrate; and a rotation mechanism rotating the holding member and the ring member about a rotation axis at rotation speeds different from each other and/or in rotational directions different from each other, the rotation axis being a vertical axis passing through the substrate held by the holding member.

A second aspect of the substrate holding apparatus according to the present invention is intended for the substrate holding apparatus of the first aspect, wherein the rotation mechanism includes a motor, a shaft coupling the motor and the holding member to each other, and a speed change mechanism coupling the shaft and the ring member rotatably relative to each other and rotating the ring member at a speed ratio to the rotation speed of the shaft.

A third aspect of the substrate holding apparatus according to the present invention is intended for the substrate holding apparatus of the second aspect, wherein the speed change mechanism includes an external gear coupled to the shaft and rotating together with the shaft, an internal gear coupled to the ring member, and a first gear part including at least one first gear provided between the external gear and the internal gear and rotating the internal gear as the external gear rotates.

A fourth aspect of the substrate holding apparatus according to the present invention is intended for the substrate holding apparatus of the third aspect, wherein the at least one first gear includes an even number of first gears, and the even number of first gears mesh with each other in series and rotate the internal gear as the external gear rotates.

A fifth aspect of the substrate holding apparatus according to the present invention is intended for the substrate holding apparatus of the third aspect, wherein the first gear part includes an odd number of first gears and rotates the internal gear as the external gear rotates.

A sixth aspect of the substrate holding apparatus according to the present invention is intended for the substrate holding apparatus of the fourth aspect. The speed change mechanism includes: a second gear part provided between the external gear and the internal gear and having an odd number of second gears meshing with each other in series, the second gear part rotating the internal gear as the external gear rotates; and a movement mechanism moving the first gear part between a first meshing position in which the first gear part is positioned between the external gear and the internal gear and a first retracted position in which the first gear part is retracted from between the external gear and the internal gear, and moving the second gear part between a second meshing position in which the second gear part is positioned between the external gear and the internal gear and a second retracted position in which the second gear part is retracted from between the external gear and the internal gear.

A seventh aspect of the substrate holding apparatus according to the present invention is intended for the substrate holding apparatus of the first aspect, wherein the rotation mechanism includes a first motor rotating the holding member; and a second motor rotating the ring member.

An eighth aspect of the substrate holding apparatus according to the present invention is intended for the substrate holding apparatus of any one of the first to seventh aspects, wherein the rotation mechanism rotates the ring member at a variable speed ratio to the rotation speed of the holding member.

A ninth aspect of the substrate holding apparatus according to the present invention is intended for the substrate holding apparatus of the eighth aspect, wherein: the rotation mechanism rotates the ring member at a first ring speed when rotating the holding member at a first holding speed; the rotation mechanism rotates the ring member at a second ring speed when rotating the holding member at a second holding speed lower than the first holding speed; and a first speed ratio of the first ring speed to the first holding speed is lower than a second speed ratio of the second ring speed to the second holding speed.

A tenth aspect of the substrate holding apparatus according to the present invention is intended for the substrate holding apparatus of any one of the first to ninth aspects, wherein the upper surface of the ring member is inclined with respect to a horizontal plane so that an outer peripheral edge of the upper surface is positioned below an inner peripheral edge of the upper surface.

An eleventh aspect of the substrate holding apparatus according to the present invention is intended for the substrate holding apparatus of any one of the first to tenth aspects, wherein the upper surface of the ring member has a hydrophilicity.

A twelfth aspect of the substrate holding apparatus according to the present invention is intended for the substrate holding apparatus of any one of the first to eleventh aspects, wherein at least one of opposed surfaces of the holding member and the ring member opposed to each other has a hydrophobicity.

A thirteenth aspect of the substrate holding apparatus according to the present invention is intended for the substrate holding apparatus of the twelfth aspect, wherein an inner peripheral surface of the ring member which is one of the opposed surfaces has a hydrophobicity.

A fourteenth aspect of the substrate holding apparatus according to the present invention is intended for the substrate holding apparatus of any one of the first to thirteenth aspects. The substrate holding apparatus further comprises an elevating mechanism moving the ring member upwardly and downwardly relative to the holding member.

A fifteenth aspect of a substrate processing apparatus according to the present invention is intended for a substrate processing apparatus comprising: a substrate holding apparatus as recited in the fourteenth aspect; a first processing liquid supply unit supplying a processing liquid to a front surface of a substrate held by the holding member; a second processing liquid supply unit supplying a processing liquid to a back surface of the substrate held by the holding member; and a controller (i) controlling the elevating mechanism to stop the ring member at a first position lying below the front surface of the substrate and causing the first processing liquid supply unit to supply the processing liquid while causing the rotation mechanism to rotate the holding member and the ring member, and (ii) controlling the elevating mechanism to stop the ring member at a second position a distance equal to the thickness of the substrate below the first position and causing the second processing liquid supply unit to supply the processing liquid while causing the rotation mechanism to rotate the holding member and the ring member.

A sixteenth aspect of a substrate processing apparatus according to the present invention is intended for a substrate processing apparatus comprising: a substrate holding apparatus as recited in any one of the first to fourteenth aspects; a processing liquid supply unit supplying a processing liquid to a front surface of a substrate held by the holding member; and a controller causing the processing liquid supply unit to supply the processing liquid while causing the rotation mechanism to rotate the holding member and the ring member, thereby performing substrate processing, wherein the holding member has an upper surface opposed to a back surface of the substrate, wherein the upper surface of the holding member extends outwardly from a peripheral edge of the substrate as seen in plan view, wherein the vertical position of the upper surface of the ring member is level with or below the upper surface of the holding member, and wherein the processing liquid flying off from the peripheral edge of the substrate flows over the upper surface of the holding member and the upper surface of the ring member in this order in the substrate processing.

Effects of the Invention

In the first aspect of the substrate holding apparatus according to the present invention, the processing liquid supplied to the front surface of the substrate during the rotation of the holding member that holds the substrate spreads over the front surface of the substrate and flies off from the peripheral edge thereof. The processing liquid on the substrate flows over the upper surface of the ring member and flies outwardly from the ring member because the upper surface of the ring member is positioned outside the substrate.

The ring member is rotated at a different rotation speed and/or in a different rotational direction from the holding member. Thus, the substrate holding apparatus is capable of adjusting the flow velocity of the processing liquid flying off from the ring member.

The second aspect of the substrate holding apparatus according to the present invention uses the single motor to rotate both of the holding member and the ring member. This contributes to the simplification of the control.

The third aspect of the substrate holding apparatus according to the present invention uses a simple configuration to provide the speed change mechanism.

The fourth aspect of the substrate holding apparatus according to the present invention is capable of rotating the ring member in the same direction as the holding member. Thus, turbulence in flows of the processing liquid is less liable to occur on the ring member.

The fifth aspect of the substrate holding apparatus according to the present invention is capable of rotating the ring member in the direction opposite to that of the holding member. This makes it easy to reduce the flow velocity of the processing liquid on the ring member.

The sixth aspect of the substrate holding apparatus according to the present invention is capable of variable control of the rotational direction of the ring member.

The seventh aspect of the substrate holding apparatus according to the present invention is capable of independently rotating the holding member and the ring member.

The eighth aspect of the substrate holding apparatus according to the present invention is capable of finer control of the flow velocity of the processing liquid than a configuration in which the ring member is rotated at a fixed speed ratio to the rotation speed of the holding member.

The ninth aspect of the substrate holding apparatus according to the present invention is capable of controlling the flow velocity of the processing liquid flying off from the ring member to within a predetermined range. That is, the flow velocity on the ring member is made lower than a predetermined upper limit and higher than a predetermined lower limit. If the flow velocity of the processing liquid is too high, the processing liquid is liable to splash back from a cup provided outside the substrate holding apparatus and to adhere to the substrate again. However, this substrate holding apparatus is capable of suppressing such re-adhesion. On the other hand, if the flow velocity of the processing liquid is too low, the processing liquid is liable to form puddles on the ring member, for example, when the supply of the processing liquid is stopped. This substrate holding apparatus is also capable of suppressing such formation of puddles.

In the tenth aspect of the substrate holding apparatus according to the present invention, the processing liquid easily flows to the outside of the ring member.

The eleventh aspect of the substrate holding apparatus according to the present invention is capable of suppressing the processing liquid splashing on the upper surface of the ring member.

The twelfth aspect of the substrate holding apparatus according to the present invention is capable of suppressing the processing liquid entering a gap between the holding member and the ring member.

The thirteenth aspect of the substrate holding apparatus according to the present invention is capable of suppressing the processing liquid entering the rotation mechanism.

The fourteenth aspect of the substrate holding apparatus according to the present invention is capable of adjusting the vertical position of the ring member relative to the holding member.

In the fifteenth aspect of the substrate processing apparatus according to the present invention, the processing liquid easily flows over the upper surface of the ring member.

DESCRIPTION OF EMBODIMENT(S)

Figure 1:
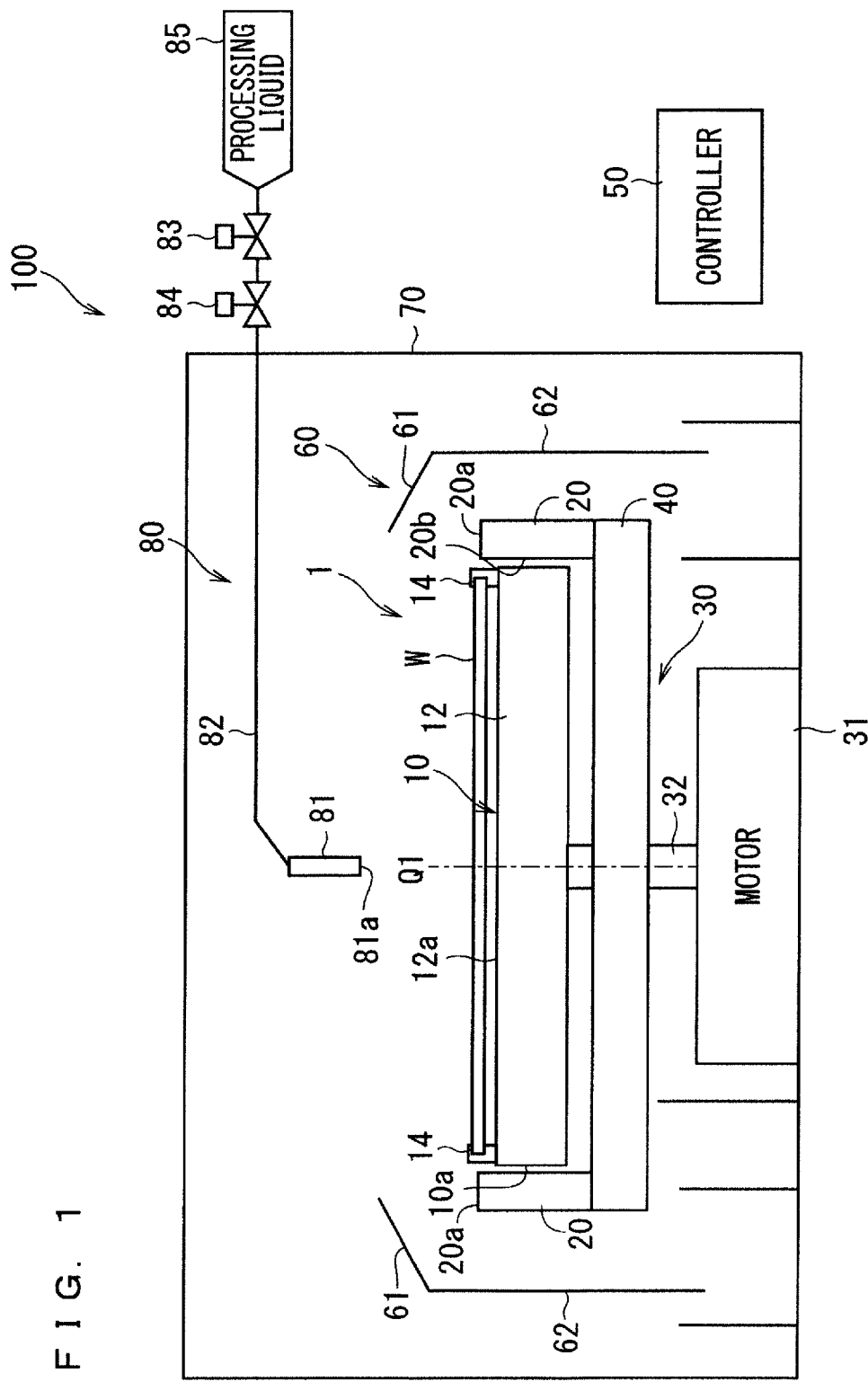
FIG. 1 is a view schematically showing an example of the configuration of a substrate processing apparatus.

An embodiment will now be described in detail with reference to the drawings. For the sake of easier understanding, the dimensions of components and the number of components are shown in exaggeration or in simplified form, as appropriate. In the drawings, like reference numerals and characters are used to designate parts similar in configuration and in function, and repetition in description is dispensed with in the following description.

Substrate Processing Apparatus

FIG. 1 is a view schematically showing an example of the configuration of a substrate processing apparatus 100. The substrate processing apparatus 100 is an apparatus for processing a substrate W. The substrate W is, for example, a semiconductor substrate, and is a plate-like substrate having a circular shape as seen in plan view. The substrate W, however, is not limited to this. The substrate W may be a substrate for a liquid crystal display panel, for example, and may be a plate-like substrate having a rectangular shape as seen in plan view.

In the example of FIG. 1, the substrate processing apparatus 100 includes a substrate holding apparatus 1, a controller 50, a cup 60, a housing 70, and a processing liquid supply part 80.

The housing 70 forms a processing chamber for processing a substrate W. This housing 70 is referred to also as a chamber. The housing 70 includes a transport opening (not shown) for transporting a substrate W therethrough into and out of the housing 70. The housing 70 further includes a shutter (not shown) for switching between opening and closing of the transport opening.

A substrate transport robot (not shown) is provided outside the substrate processing apparatus 100. This substrate transport robot transfers a substrate W to and from the substrate processing apparatus 100. Specifically, the substrate transport robot transports a substrate W from outside to inside or from inside to outside the housing 70 through the transport opening opened by the shutter.

The substrate holding apparatus 1 is provided inside the housing 70, and holds a substrate W in a horizontal attitude. The substrate holding apparatus 1 rotates the substrate W about a rotation axis Q1 that is a vertically extending axis passing through the center of the substrate W. This substrate holding apparatus 1 is referred to also as a spin chuck. The specific configuration of the substrate holding apparatus 1 will be described later in detail.

The processing liquid supply part 80 supplies a processing liquid to a front surface of a substrate W. Specifically, the processing liquid supply part 80 includes a nozzle 81, a pipe 82, an on-off valve 83, and a flow regulating valve 84. In the housing 70, the nozzle 81 having an orifice 81a is disposed in an attitude such that the orifice 81a is oriented downwardly. The nozzle 81 is positioned over the substrate W held by the substrate holding apparatus 1, and ejects the processing liquid from the orifice 81a thereof to supply the processing liquid to the front surface of the substrate W. The processing liquid is not particularly limited, but includes any chemical liquid and any rinsing liquid (cleaning liquid).

The pipe 82 has a first end connected to the nozzle 81 and a second end connected to a processing liquid supply source 85. The on-off valve 83 is interposed in the pipe 82. By opening the on-off valve 83, the processing liquid from the processing liquid supply source 85 flows through the interior of the pipe 82 and is ejected from the orifice 81a of the nozzle 81. By closing the on-off valve 83, the ejection of the processing liquid from the orifice 81a of the nozzle 81 is stopped. The flow regulating valve 84 is interposed in the pipe 82. The flow regulating valve 84 regulates the amount of processing liquid flowing through the interior of the pipe 82.

The cup 60 has a substantially tubular (e.g., cylindrical) shape, and is provided so as to surround the substrate holding apparatus 1 in the housing 70. The cup 60 includes a side surface part 62 extending in a vertical direction, and an overhang part 61 inclined inwardly in an upward direction from an upper end of the side surface part 62. The overhang part 61 includes an upper end portion having a circular shape as seen in plan view and positioned outside a peripheral edge of the substrate W. That is, an upper edge portion of the overhang part 61 surrounds the peripheral edge of the substrate W as seen in plan view. The cup 60 is disposed so that the upper end portion of the overhang part 61 is above the front surface of the substrate W.

The processing liquid flying off from the peripheral edge of the substrate W collides with an inner peripheral surface of the cup 60, and falls by gravity. For example, a collection opening (not shown) for collecting the processing liquid is formed in a lower surface of the housing 70. The processing liquid flows through the collection opening to the outside.

The controller 50 controls the entire substrate processing apparatus 100. Specifically, the controller 50 controls the opening and closing of the on-off valve 83, the degree of opening of the flow regulating valve 84, and the rotation of the substrate holding apparatus 1. The controller 50 is also capable of controlling the shutter provided on the housing 70.

The controller 50 is an electronic circuit device, and may include a data processor and a storage medium. The data processor may be, for example, an arithmetic processor such as a CPU (Central Processor Unit). The storage part may include a non-temporary storage medium (for example, a ROM (Read Only Memory) or a hard disk) and a temporary storage medium (for example, a RAM (Random Access Memory)). A program for defining the processing that the controller 50 executes, for example, may be stored in the non-temporary storage medium. The processor executes this program, whereby the controller 50 is able to execute the processing defined by the program. Of course, part or all of the processing that the controller 50 executes may be executed by hardware.

While rotating the substrate W held by the substrate holding apparatus 1, the controller 50 opens the on-off valve 83. Thus, the processing liquid ejected from the orifice 81a of the nozzle 81 adheres to the front surface of the substrate W, is subjected to centrifugal force to spread on the front surface of the substrate W, and flies off from the peripheral edge of the substrate W toward the cup 60.

In this manner, the processing based on the processing liquid is performed on the substrate W by supplying the processing liquid to the entire front surface of the substrate W. For example, when the processing liquid is a chemical liquid for etching, the front surface of the substrate W with a resist pattern formed thereon is etched as appropriate. Also, for example, when the processing liquid is a chemical liquid for for resist removal, a resist pattern is removed from the front surface of the substrate W on which the resist pattern has been formed.

Substrate Holding Apparatus

Figure 2:
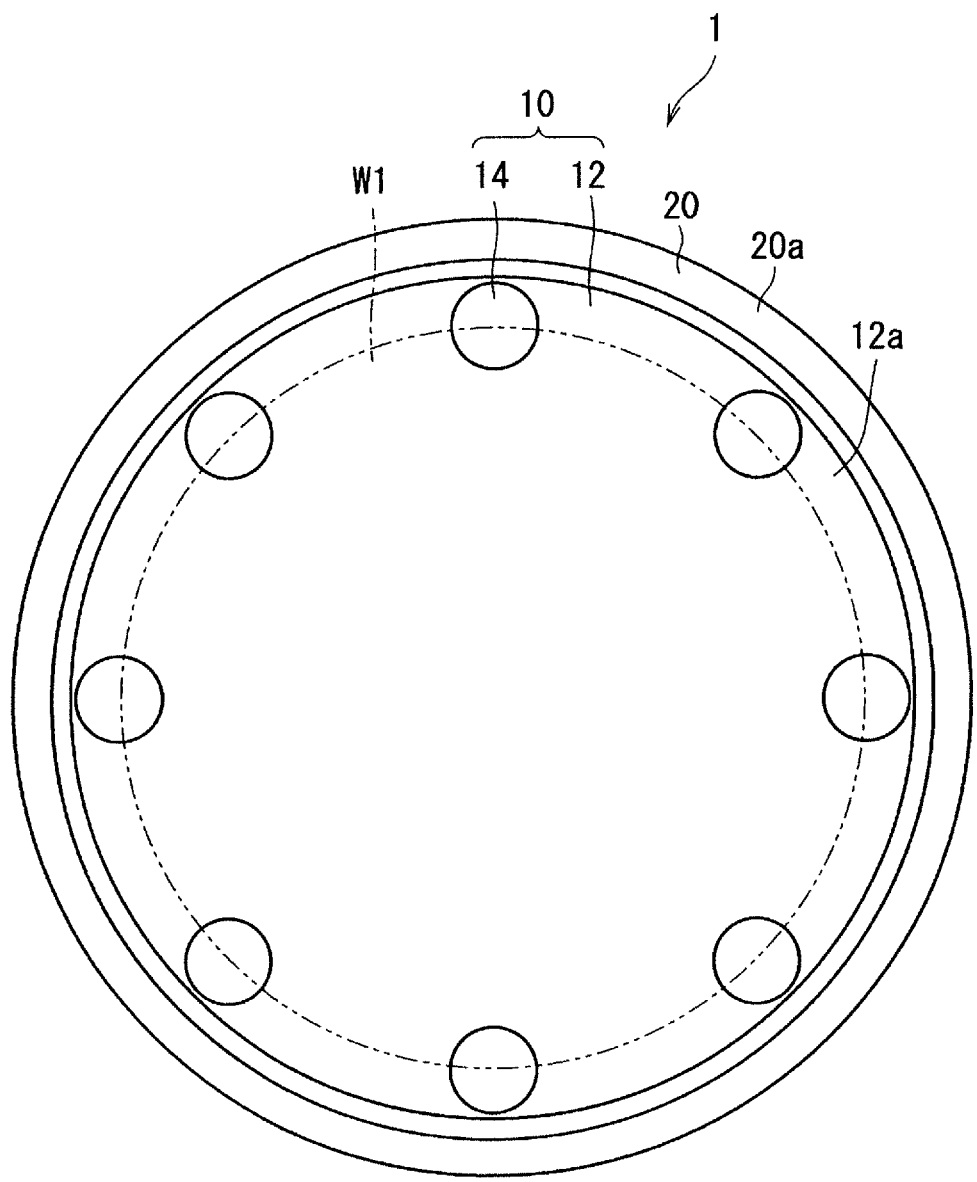
FIG. 2 is a plan view schematically showing an example of the configuration of a substrate holding apparatus.
Figure 3:
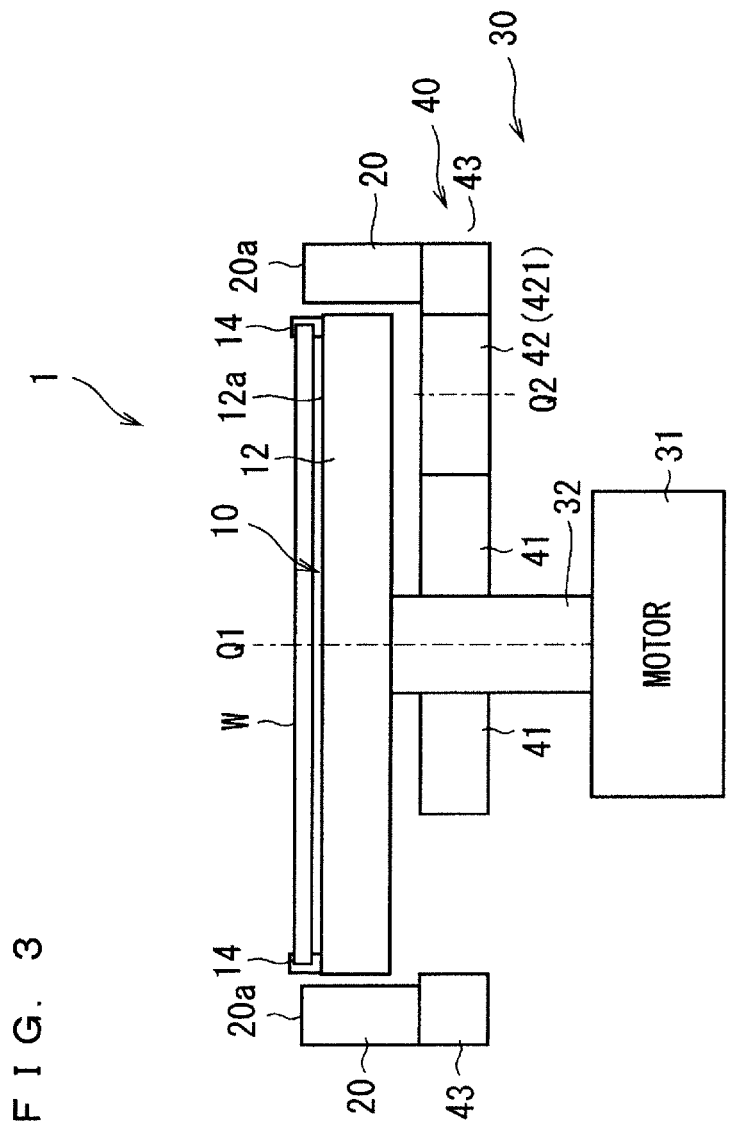
FIG. 3 is a sectional view schematically showing an example of the configuration of the substrate holding apparatus.

FIG. 2 is a plan view schematically showing an example of the configuration of the substrate holding apparatus 1. FIG. 3 is a sectional view schematically showing an example of the configuration of the substrate holding apparatus 1.

The substrate holding apparatus 1 includes a holding member 10, a ring member 20, and a rotation mechanism 30. The holding member 10 holds a substrate W in a horizontal attitude. In other words, the substrate W is held in an attitude such that the thickness direction thereof extends in a vertical direction. In the example of FIGS. 1 to 3, the holding member 10 includes a base member 12 and a plurality of pins 14. For example, the base member 12 is disk-shaped, and has an upper surface 12a opposed in spaced apart relation to a back surface of the substrate W as seen in a vertical direction. The upper surface 12a of the base member 12 is substantially horizontal. The base member 12 is disposed so that the central axis thereof extends along the rotation axis Q1.

The pins 14 protrude from the upper surface 12a of the base member 12 toward the substrate W. The pins 14 are arranged in spaced apart relation along the peripheral edge of the substrate W as seen in plan view, and holds the peripheral edge of the substrate W. The pins 14 are referred to also as chuck pins.

The configuration of the holding member 10 is not limited to this. In short, it is only necessary for the configuration of the holding member 10 to hold the substrate W in a horizontal attitude. The holding member 10 may have any other configuration (for example, a configuration having a suction mechanism for attracting a substrate by suction).

The ring member 20 is in a shape of a ring. The ring member 20 has an inner diameter greater than an outer diameter of the holding member 10 (in this case, an outer diameter of the base member 12). The ring member 20 is provided so as to surround the holding member 10 as seen in plan view. The ring member 20 is disposed so that the central axis thereof extends along the rotation axis Q1. The ring member 20 has an upper surface 20a positioned outside the substrate W as seen in plan view and surrounding the peripheral edge of the substrate W. In the example of FIG. 3, the upper surface 20a of the ring member 20 is substantially horizontal, and the ring member 20 has a section (a section including the rotation axis Q1) of a substantially rectangular shape.

The ring member 20 is disposed so that the upper surface 20a thereof is level with or below the front surface of the substrate W. More specifically, the vertical position of the ring member 20 is defined so that the processing liquid flying off from the front surface of the substrate W flows over the upper surface 20a of the ring member 20. In the example of FIG. 3, the upper surface 20a of the ring member 20 is provided slightly below the front surface of the substrate W.

With reference also to FIG. 1, the upper surface 20a of the ring member 20 has an outer peripheral edge positioned outside an upper end portion of the cup 60 (the upper end portion of the overhang part 61) as seen in plan view. That is, at least part of the ring member 20 is vertically opposed to part of the overhang part 61 of the cup 60. Also, the ring member 20 is opposed in spaced apart relation to the cup 60 as seen in a radial direction with respect to the rotation axis Q1.

The rotation mechanism 30 rotates the holding member 10 about the rotation axis Q1. The substrate W held by the holding member 10 accordingly rotates about the rotation axis Q1. The rotation mechanism 30 also rotates the ring member 20 about the rotation axis Q1 at a rotation speed different from that of the holding member 10 and/or in a rotational direction different from that of the holding member 10.

In the example of FIG. 1, the rotation mechanism 30 includes a motor 31, a shaft 32, and a speed change mechanism 40. The shaft 32 has a cylindrical shape extending in a vertical direction, and is disposed so that the central axis thereof extends along the rotation axis Q1. This shaft 32 has a first end coupled to the holding member 10 and a second end coupled to the motor 31. The shaft 32 and the motor 31 are provided under the holding member 10. The motor 31 is controlled by the controller 50 to rotate the shaft 32 about the rotation axis Q1. Accordingly, the holding member 10 coupled to the shaft 32 rotates about the rotation axis Q1, and the substrate W held by the holding member 10 rotates about the rotation axis Q1.

Figure 4:
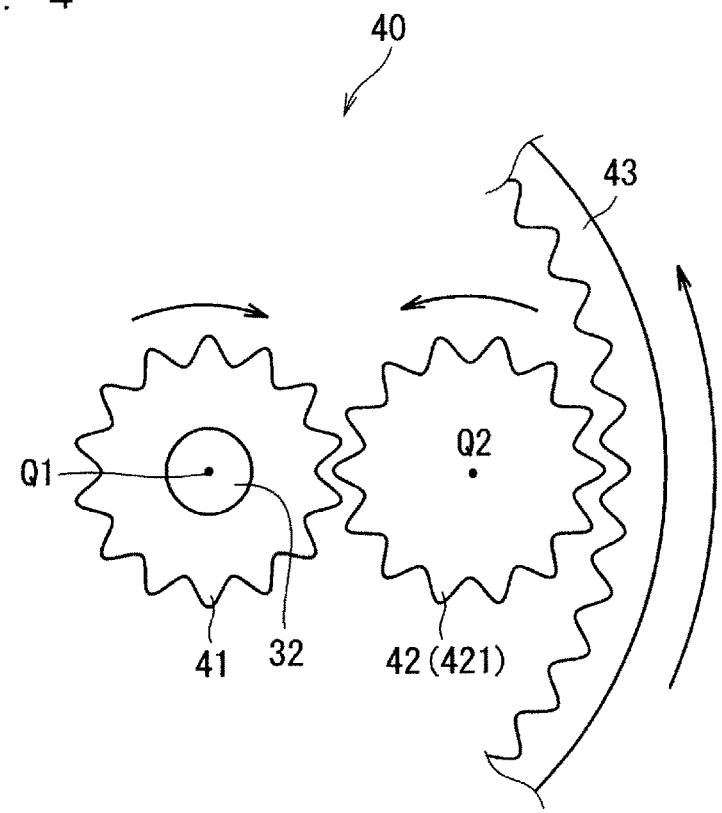
FIG. 4 is a view schematically showing an example of the configuration of a speed change mechanism.

The speed change mechanism 40 couples the shaft 32 and the ring member 20 rotatably relative to each other, and rotates the ring member 20 at a predetermined speed ratio to the rotation speed of the shaft 32. For example, the speed change mechanism 40 includes a plurality of gears. FIG. 4 is a plan view schematically showing an example of the configuration of the speed change mechanism 40. In the example of FIGS. 3 and 4, the speed change mechanism 40 includes an external gear 41, a gear part 42, and an internal gear 43.

The external gear 41 is disposed in an attitude such that the thickness direction thereof extends in a vertical direction. A shaft through hole extending through the external gear 41 in a vertical direction is formed in the center of the external gear 41. The external gear 41 is coupled to the shaft 32 by disposing the shaft 32 through the shaft through hole. With the shaft 32 disposed through the shaft through hole, the external gear 41 is positioned between the holding member 10 and the motor 31. That is, the external gear 41 is coupled to an intermediate portion of the shaft 32.

The motor 31 rotates the shaft 32 about the rotation axis Q1, whereby the external gear 41 coupled to the shaft 32 rotates about the rotation axis Q1. The external gear 41 has a plurality of teeth (protrusions) formed on an outer peripheral surface of the external gear 41 and arranged circumferentially about the rotation axis Q1. These teeth protrude radially outwardly with respect to the rotation axis Q1.

The internal gear 43 is in a shape of a ring, and is disposed in an attitude such that the central axis thereof extends along the rotation axis Q1. The internal gear 43 has a plurality of teeth formed on an inner peripheral surface of the internal gear 43 and arranged circumferentially about the rotation axis Q1. These teeth protrude radially inwardly with respect to the rotation axis Q1. The internal gear 43 is coupled to a lower surface of the ring member 20. The ring member 20 accordingly rotates as the internal gear 43 rotates.

It should be noted that the ring member 20 and the internal gear 43 may be formed integrally using the same material. That is, the ring member 20 may be configured to extend downwardly to below a lower surface of the holding member 10 and to have a plurality of teeth formed in an inner peripheral surface of a portion of the ring member 20 which lies below the holding member 10. In this case, this portion of the ring member 20 functions as the internal gear 43.

The internal gear 43 is fixed to the housing 70 so as to be able to rotate about the rotation axis Q1. For example, a thrust bearing (not shown) about the rotation axis Q1 may be fixed to a floor surface of the housing 70, and the internal gear 43 may be coupled to the thrust bearing. It is, however, only necessary that the internal gear 43 is rotatable relative to the housing 70. The internal gear 43 may be rotatably fixed to a different member (e.g., the shaft 32) fixed to the housing 70. In this case, the internal gear 43 is fixed by way of the different member to the housing 70.

The external gear 41 is opposed in spaced apart relation to the internal gear 43 as seen in a radial direction with respect to the rotation axis Q1. That is, the tip diameter of the external gear 41 is less than that of the internal gear 43. The gear part 42 is provided between the external gear 41 and the internal gear 43, and is in meshing engagement with the external gear 41 and the internal gear 43. This gear part 42 rotates the internal gear 43 at a predetermined speed ratio to the rotation of the external gear 41. In the example of FIGS. 3 and 4, the gear part 42 includes at least one external gear 421. This external gear 421 in an attitude such that the thickness direction thereof extends in a vertical direction is disposed between the external gear 41 and the internal gear 43.

The external gear 421 is in a fixed position, and is fixed to the housing 70 so as to be able to rotate about a rotation axis Q2 extending in a vertical direction. For example, a shaft with the rotation axis Q2 serving as a central axis thereof may be provided on the floor surface of the housing 70, and the external gear 421 may be rotatably coupled to the shaft. More specifically, a radial bearing may be provided on the shaft, and the external gear 421 may be coupled to the radial bearing.

The external gear 421 has a plurality of teeth formed on an outer peripheral surface of the external gear 421 and arranged circumferentially about the rotation axis Q2. These teeth protrude radially outwardly with respect to the rotation axis Q2. The external gear 421 is in meshing engagement with the external gear 41 and the internal gear 43.

The at least one external gear 421 may include a plurality of external gears 421. In that case, the external gears 421 are provided in respective different positions as seen in a circumferential direction about the rotation axis Q1 between the external gear 41 and the internal gear 43.

In such a speed change mechanism 40, the motor 31 rotates the shaft 32, whereby the external gears 41 and 421 and the internal gear 43 rotate. Specifically, the external gear 41, which is coupled to the shaft 32, rotates in the same rotational direction and at the same rotation speed as the shaft 32. The teeth of the external gear 41 push the teeth of the external gear 421 in a circumferential direction about the rotation axis Q2, whereby the external gear 421 rotates about the rotation axis Q2. The external gear 421 rotates in a direction opposite to the rotational direction of the external gear 41.

The teeth of the external gear 421 push the teeth of the internal gear 43 in a circumferential direction about the rotation axis Q1, whereby the internal gear 43 rotates about the rotation axis Q1. The internal gear 43 rotates in the same rotational direction as the external gear 421. Thus, the internal gear 43 rotates in a direction opposite to the rotational direction of the external gear 41.

The speed ratio (=V2/V1) of the rotation speed V2 of the internal gear 43 to the rotation speed V1 of the external gear 41 is determined by the numbers of teeth of the external gear 41 and the internal gear 43. Specifically, this speed ratio (=V2/V1) is equal to the ratio (=Z1/Z3) of the number Z1 of teeth of the external gear 41 to the number Z3 of teeth of the internal gear 43. The internal gear 43 rotates at the rotation speed V2 lower than the rotation speed V1 of the external gear 41 because the number Z1 of teeth of the external gear 41 is lower than the number Z3 of teeth of the internal gear 43.

The external gear 41 is coupled through the shaft 32 to the holding member 10. Thus, the holding member 10 rotates in the same rotational direction as the external gear 41, and the rotation speed of the holding member 10 is ideally equal to the rotation speed V1. Also, the internal gear 43 is coupled to the ring member 20. Thus, the ring member 20 rotates in the same rotational direction as the internal gear 43, and the rotation speed of the ring member 20 is ideally equal to the rotation speed V2.

According to this speed change mechanism 40 as described above, the holding member 10 and the ring member 20 rotate in directions opposite to each other as the motor 31 rotates, and the rotation speed V2 of the ring member 20 is equal to the product (=V1·Z1/Z3) of the speed ratio (Z1/Z3) depending on the numbers Z1 and Z3 of teeth of the external and internal gears 41 and 43 and the rotation speed V1 of the holding member 10. The ring member 20 rotates at the rotation speed V2 lower than the rotation speed V1 of the holding member 10 because the number Z1 of teeth of the external gear 41 is lower than the number Z3 of teeth of the internal gear 43 as mentioned above. The rotation speed of the holding member 10 and the rotation speed of the ring member 20 are referred to as a holding speed and a ring speed, respectively, in some cases.

Such a speed change mechanism 40 is what is called a star-type planetary gear mechanism. The external gear 41 and the external gear 421 function as a sun gear and a planetary gear, respectively. The external gear 421 functions also as an idle gear for transmitting the rotational force.

Operation of Processing of Substrate

Figure 5:
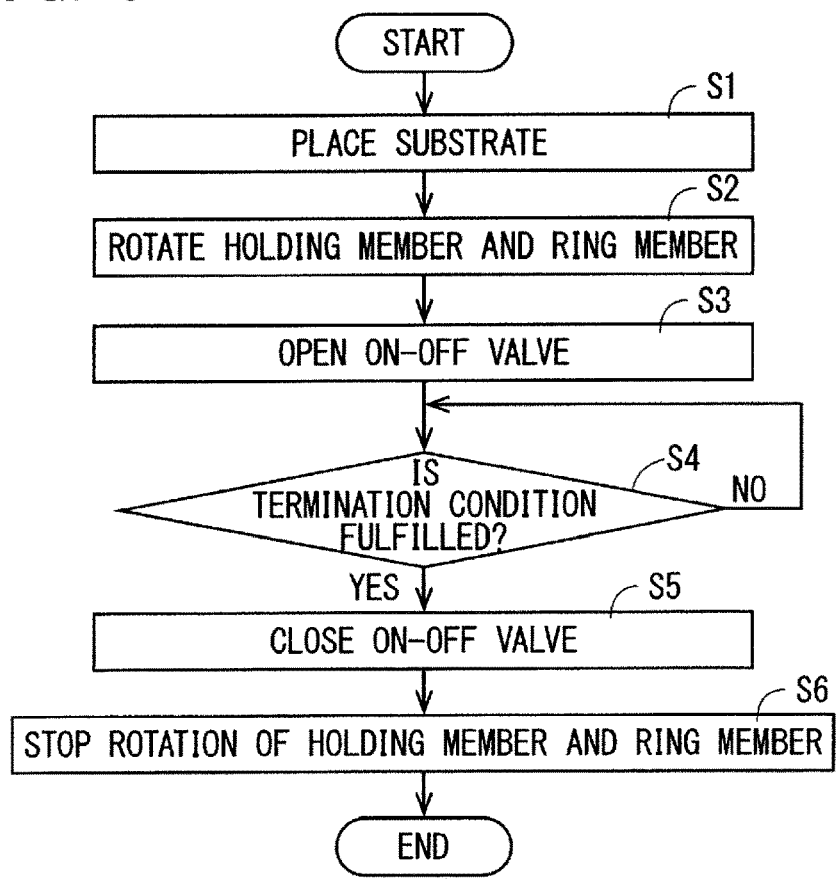
FIG. 5 is a flow diagram showing an example of the operation of the substrate processing apparatus.

FIG. 5 is a flow diagram showing an example of the operation of the substrate processing apparatus 100. First, a substrate W is placed on the holding member 10 in Step S1. Specifically, the controller 50 opens the shutter of the housing 70, and then causes the substrate transport robot to transport the substrate W into the substrate processing apparatus 100. That is, the substrate transport robot moves a hand with the substrate W placed thereon through the transport opening into the housing 70 to place the substrate W on the holding member 10. Thus, the holding member 10 holds the substrate W. Thereafter, the controller 50 moves the hand of the substrate transport robot to the outside of the housing 70, and then closes the shutter.

Next, in Step S2, the controller 50 controls the rotation mechanism 30 to rotate the holding member 10 and the ring member 20. Specifically, the controller 50 controls the motor 31 to rotate the holding member 10 at the holding speed V1. Accordingly, the substrate W held by the holding member 10 also rotates at the holding speed V1. The speed change mechanism 40 rotates the ring member 20 at a predetermined speed ratio to the holding speed V1 of the holding member 10. Specifically, the external gears 41 and 421 and the internal gear 43 rotate as mentioned above, and the ring member 20 coupled to the internal gear 43 rotates at the ring speed V2. At this time, the ring speed V2 is lower than the holding speed V1.

Next, in Step S3, the controller 50 opens the on-off valve 83 to supply the processing liquid to the front surface of the substrate W. The processing liquid adhering to the front surface of the substrate W is subjected to the centrifugal force resulting from the rotation of the substrate W to spread over the front surface of the substrate W. Thus, the processing based on the processing liquid is performed on the substrate W.

This processing liquid flies off from the peripheral edge of the substrate W to flow over the upper surface 20a of the ring member 20. This processing liquid on the upper surface 20a of the ring member 20 is subjected to a force depending on the rotation of the ring member 20 to flow radially outwardly, and then flies off from an outer peripheral edge of the ring member 20 toward the cup 60.

Next, in Step S4, the controller 50 judges whether a termination condition for the substrate processing is fulfilled or not. For example, the controller 50 judges whether the amount of time elapsed from Step S3 is longer than a first predetermined time period or not. If a positive judgment is made, it may be judged that the termination condition is fulfilled. If it is judged that the termination condition is not fulfilled, the controller 50 executes Step S4 again.

If it is judged that the termination condition is fulfilled, the controller 50 closes the on-off valve 83 in Step S5 to terminate the supply of the processing liquid. Thus, the processing of the substrate W based on the processing liquid is substantially terminated.

Next, in Step S6, the controller 50 controls the rotation mechanism 30 to stop the rotation of the holding member 10 and the ring member 20. More specifically, the controller 50 stops the rotation of the motor 31.

The processing of the substrate W based on the processing liquid is performed by the operation described hereinabove. According to the substrate processing apparatus 100, the ring member 20 rotates at the ring speed V2 lower than the holding speed V1 of the holding member 10. Thus, the centrifugal force that the processing liquid is subjected to on the upper surface 20a of the ring member 20 is reduced below the centrifugal force that the processing liquid is subjected to on the front surface of the substrate W. This reduces the velocity (flow velocity) of the processing liquid flying off from the outer peripheral edge of the ring member 20, as compared with the velocity obtained when the holding member 10 and the ring member 20 rotate integrally.

Figure 6:
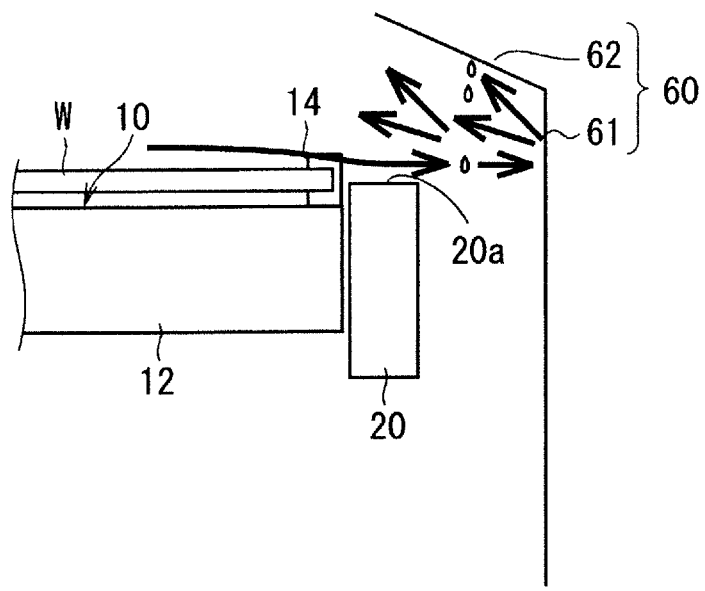
FIG. 6 is a view schematically showing an example of flows of a processing liquid.

When the flow velocity of the processing liquid flying off from the outer peripheral edge of the ring member 20 is high, the processing liquid can be splashed back from the inner peripheral surface of the cup 60 and adhere to the substrate W again. FIG. 6 is a view schematically showing an example of flows of the processing liquid. Such an example of flows of the processing liquid is schematically indicated by thick arrows in FIG. 6. In the example of FIG. 6, part of the processing liquid flying outwardly from the outer peripheral edge of the ring member 20 is splashed back from the inner peripheral surface of the cup 60. Although shown in FIG. 6 as splashed back obliquely upwardly due to the surface roughness and the like of the inner peripheral surface of the cup 60, the processing liquid is actually splashed back also obliquely downwardly from the inner peripheral surface of the cup 60. The processing liquid splashed back obliquely upwardly can adhere to the substrate W again. Also, when droplets of the processing liquid adhering to the inner peripheral surface of the overhang part 61 of the cup 60 fall, there is a likelihood that the processing liquid flying off from the outer peripheral edge of the ring member 20 collides with the falling droplets, is splashed back, and adheres to the substrate W again.

The higher the flow velocity of the processing liquid flying off from the outer peripheral edge of the ring member 20, the more liable to occur the aforementioned re-adhesion of the processing liquid to the substrate W.

As mentioned above, this substrate holding apparatus 1 is capable of reducing the flow velocity of the processing liquid flying off from the outer peripheral edge of the ring member 20 to thereby suppress the re-adhesion of the processing liquid to the substrate W.

In the aforementioned example, the rotation mechanism 30 includes the speed change mechanism 40. In this case, the single motor 31 may be used to rotate both the holding member 10 and the ring member 20. This simplifies the control.

In the aforementioned example, the speed change mechanism 40 is comprised of the external gear 41, the gear part 42, and the internal gear 43. This provides the speed change mechanism 40 using a simplified configuration.

The aforementioned speed change mechanism 40 is capable of rotating the ring member 20 in the direction opposite to that of the holding member 10. This further reduces the flow velocity of the processing liquid on the ring member 20. This will be described below in detail.

The processing liquid flowing over the front surface of the substrate W will be first described. This processing liquid is subjected to the force resulting from the rotation of the substrate W to spread over the front surface of the substrate W. This force includes the centrifugal force directed radially outwardly with respect to the rotation axis Q1 and a frictional force developed between the processing liquid and the front surface of the substrate W. This frictional force includes a circumferential component. Thus, the processing liquid does not flow radially outwardly but flows outwardly in a direction inclined toward the rotational direction with respect to the radial direction. That is, the flow velocity of the processing liquid flying off from the peripheral edge of the substrate W includes a velocity component directed radially outwardly and a velocity component directed toward the rotational direction.

When the speed change mechanism 40 rotates the ring member 20 in the direction opposite to that of the holding member 10, the processing liquid flying off from the peripheral edge of the substrate W is subjected to the opposite circumferential frictional force on the upper surface 20a of the ring member 20. This cancels the circumferential velocity component of the processing liquid to further reduce the flow velocity of the processing liquid. Therefore, the re-adhesion of the processing liquid to the substrate W is further suppressed.

Speed Change Mechanism

The aforementioned speed change mechanism 40 rotates the holding member 10 and the ring member 20 in the directions opposite to each other. The present invention, however, is not limited to this. The speed change mechanism 40 may rotate the holding member 10 and the ring member 20 in the same direction.

Figure 7:
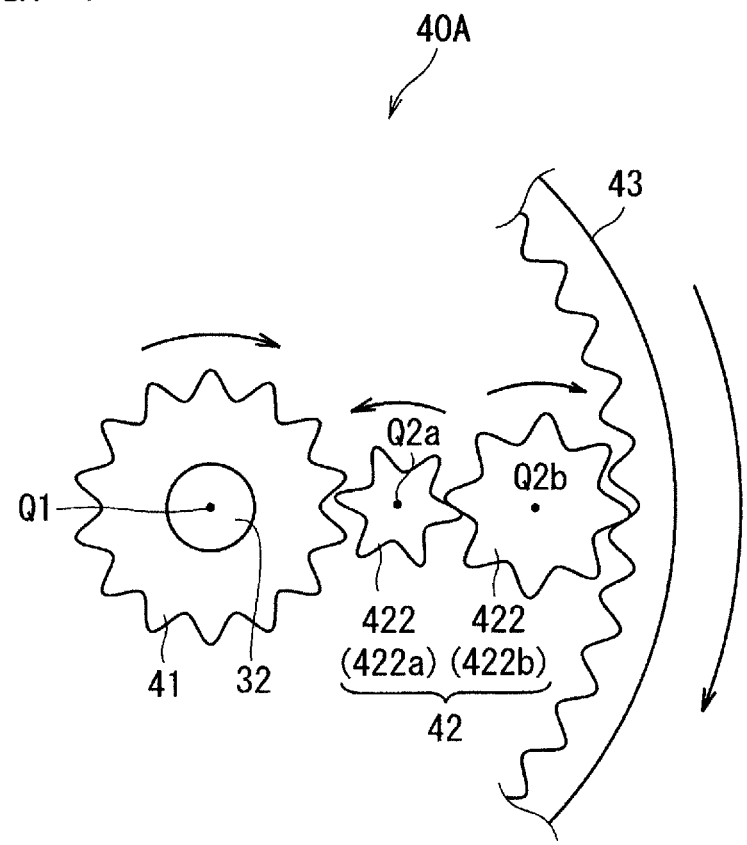
FIG. 7 is a view schematically showing an example of the configuration of the speed change mechanism.

FIG. 7 is a plan view schematically showing an example of the configuration of a speed change mechanism 40A. The speed change mechanism 40A differs from the speed change mechanism 40 in specific internal configuration of the gear part 42. The gear part 42 of the speed change mechanism 40A includes an even number of external gears 422 in place of the external gear 421. In the example of FIG. 7, two external gears 422a and 422b are provided as the even number of external gears 422. This external gears 422a and 422b in an attitude such that the thickness direction thereof extends in a vertical direction are disposed between the external gear 41 and the internal gear 43. The external gears 422a and 422b are arranged in a radial direction with respect to the rotation axis Q1, and are fixed to the housing 70 so as to be able to rotate about rotation axes Q2a and Q2b, respectively. Each of the external gears 422a and 422b has a plurality of teeth formed on an outer peripheral surface thereof and arranged circumferentially. The external gears 422a and 422b are in meshing engagement with each other. The external gear 422a is also in meshing engagement with the external gear 41, and the external gear 422b is also in meshing engagement with the internal gear 43. In other words, the external gears 422a and 422b mesh with each other in series between the external gear 41 and the internal gear 43. These external gears 422a and 422b function as idle gears for transmitting the rotational force.

According to such a speed change mechanism 40A, the external gears 41, 422a and 422b and the internal gear 43 rotate as the motor 31 rotates. Specifically, the external gear 41 rotates the external gear 422a, the external gear 422a rotates the external gear 422b, and the external gear 422b rotates the internal gear 43. In this speed change mechanism 40A, the external gears 41 and 422a rotate in directions opposite to each other. The external gears 422a and 422b rotate in directions opposite to each other. The external gear 422b and the internal gear 43 rotate in the same direction. Thus, the external gear 41 and the internal gear 43 rotate in the same direction. Accordingly, the holding member 10 and the ring member 20 rotate in the same direction.

At this time, the ring speed V2 of the ring member 20 is also equal to the product of the speed ratio (Z1/Z3) depending on the numbers Z1 and Z3 of teeth of the external and internal gears 41 and 43 and the holding speed V1 of the holding member 10. The ring speed V2 of the ring member 20 is lower than the holding speed V1 of the holding member 10 because the number Z1 of teeth of the external gear 41 is lower than the number Z3 of teeth of the internal gear 43.

This speed change mechanism 40A is hence capable of reducing the flow velocity of the processing liquid flying off from the outer peripheral edge of the ring member 20, as compared with the flow velocity obtained when the holding member 10 and the ring member 20 rotate integrally. This suppresses the re-adhesion of the processing liquid to the substrate W.

According to the speed change mechanism 40A, the holding member 10 and the ring member 20 are the same in rotational direction. The circumferential component of the force that the processing liquid is subjected to on the front surface of the substrate W is the same in direction as the circumferential component of the force that the processing liquid is subjected to on the upper surface 20a of the ring member 20. This allows the processing liquid to flow smoothly from the front surface of the substrate W to the upper surface 20a of the ring member 20. In other words, turbulence in flows of the processing liquid is less liable to occur on the upper surface 20a of the ring member 20. Specifically, when the holding member 10 and the ring member 20 rotate in the directions opposite to each other, the processing liquid flying off from the peripheral edge of the substrate W is subjected to the force opposite to the circumferential flow from the ring member 20, so that turbulence can occur in the flows of the processing liquid. On the other hand, when the holding member 10 and the ring member 20 rotate in the same direction, such turbulence in the flows of the processing liquid is suppressed. The increase in turbulence in the processing liquid can splash the processing liquid to result in the adhesion of the processing liquid to unintended members. However, the speed change mechanism 40A suppresses or avoids the occurrence of such situations.

In the example of FIGS. 3 and 4, the gear part 42 of the speed change mechanism 40 includes the one external gear 421 in order to rotate the ring member 20 in the direction opposite to that of the holding member 10. However, the speed change mechanism 40 may include an odd number of external gears 421 meshing with each other in series between the external gear 41 and the internal gear 43. This also allows the ring member 20 to rotate in the direction opposite to that of the holding member 10.

Substrate Processing Apparatus 100A

In the aforementioned example, the substrate processing apparatus 100 supplies one type of processing liquid to the substrate W. The present invention, however, is not limited to this. The substrate processing apparatus 100 may supply a plurality of types of processing liquids to the substrate W to perform a plurality of types of processing sequentially on the substrate W.

Figure 8:
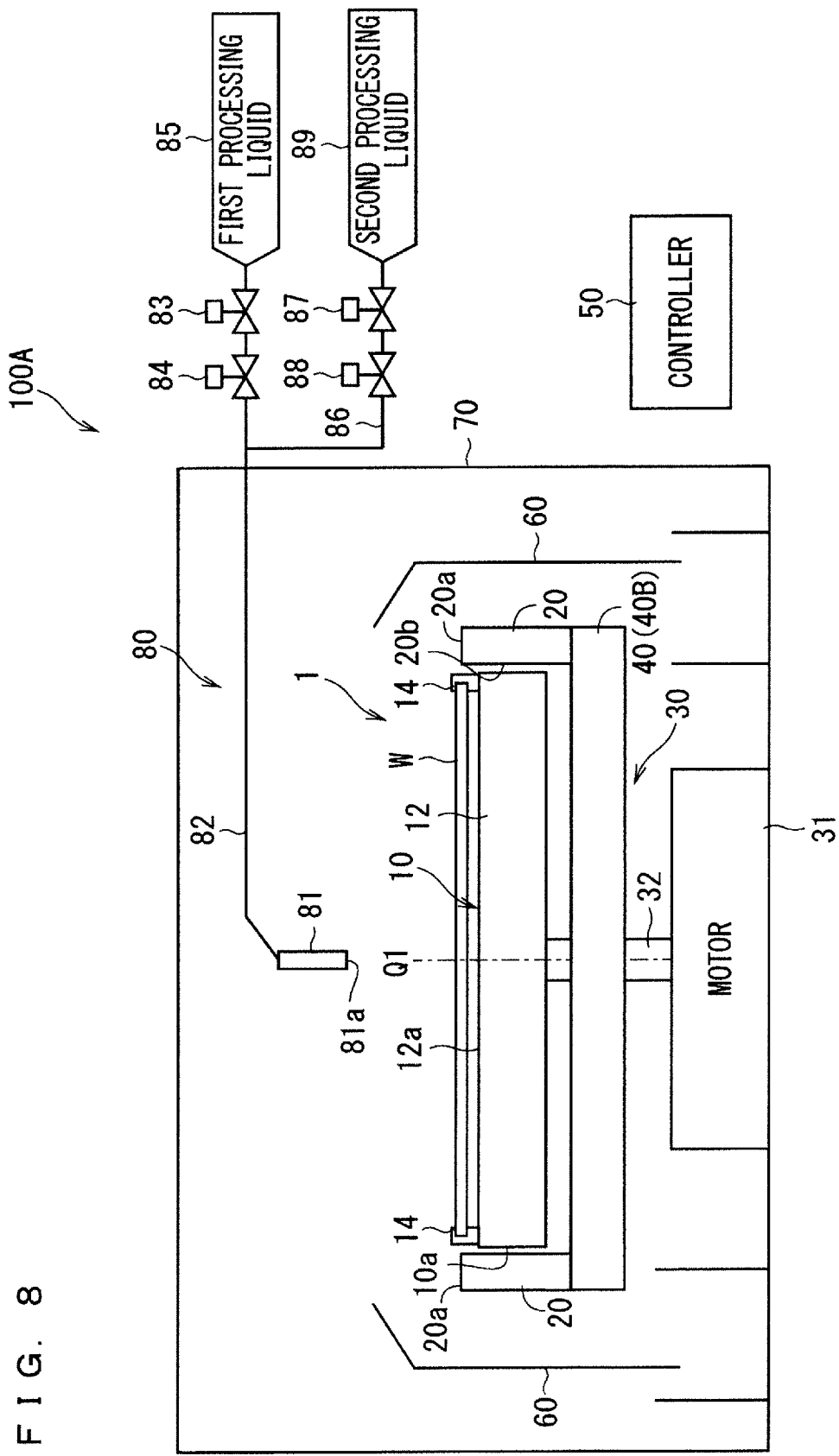
FIG. 8 is a view schematically showing an example of the configuration of the substrate processing apparatus.

FIG. 8 is a view schematically showing an example of the configuration of a substrate processing apparatus 100A. The substrate processing apparatus 100A differs from the substrate processing apparatus 100 in internal configuration of the processing liquid supply part 80 and in internal configuration of the speed change mechanism 40. The processing liquid supply part 80 in the substrate processing apparatus 100A includes the nozzle 81, pipes 82 and 86, on-off valves 83 and 87, and flow regulating valves 84 and 88.

The pipe 86 has a first end coupled to the pipe 82 and a second end coupled to a processing liquid supply source 89. More specifically, the first end of the pipe 86 is coupled to the pipe 82 in a location downstream of the on-off valve 83 and the flow regulating valve 84. The processing liquid supply source 89 supplies a processing liquid different from that of the processing liquid supply source 85 to the second end of the pipe 86. The on-off valve 87 is interposed in the pipe 86. By opening the on-off valve 87, the processing liquid from the processing liquid supply source 89 flows through the interiors of the pipes 86 and 82 and is ejected from the orifice 81a of the nozzle 81. By closing the on-off valve 87, the ejection of the processing liquid from the orifice 81a of the nozzle 81 is stopped. The controller 50 controls the opening and closing of the on-off valve 87. The flow regulating valve 88 is interposed in the pipe 86. The flow regulating valve 88 regulates the amount of processing liquid flowing through the interior of the pipe 86. The controller 50 controls the degree of opening of the flow regulating valve 88.

The controller 50 opens the on-off valve 83 and closes the on-off valve 87 to cause the processing liquid (referred to hereinafter as a first processing liquid) from the processing liquid supply source 85 to be ejected from the orifice 81a of the nozzle 81. The controller 50 closes the on-off valve 83 and opens the on-off valve 87 to cause the processing liquid (referred to hereinafter as a second processing liquid) from the processing liquid supply source 89 to be ejected from the orifice 81a of the nozzle 81.

Although the single nozzle 81 common to the first processing liquid and the second processing liquid is used in the example of FIG. 8, two nozzles may be individually used for the first processing liquid and the second processing liquid. That is, a first nozzle 81 for ejecting the first processing liquid and a second nozzle 81 for ejecting the second processing liquid may be provided. In this case, the second end of the pipe 86 is connected to the second nozzle 81.

When supplying the first processing liquid to the substrate W, the controller 50 controls the rotation mechanism 30 to rotate the holding member 10 at a holding speed V11. When supplying the second processing liquid to the substrate W, the controller 50 controls the rotation mechanism 30 to rotate the holding member 10 at a holding speed V12. Values suitable for the processing using the first processing liquid and the second processing liquid are used for the holding speed V11 and the holding speed V12, respectively. In this case, the holding speed V11 is higher than the holding speed V12, as an example. For example, the holding speed V11 is approximately 1000 [rpm], and the holding speed V12 is approximately 500 [rpm].

The flow velocity of the processing liquid flying off from the peripheral edge of the substrate W is higher during the processing using the first processing liquid than during the processing using the second processing liquid because the holding speed V11 is higher than the holding speed V12. For sufficient reduction in flow velocity of the processing liquid flying off from the outer peripheral edge of the ring member 20, it is desirable that the flow velocity of the processing liquid is more greatly reduced by means of the ring member 20 during the processing using the first processing than during the processing using the second processing. That is, it is desirable that the amount of reduction in flow velocity of the processing liquid by means of the ring member 20 is made greater when the holding speed of the holding member 10 is high than when the holding speed of the holding member 10 is low.

Speed Change Mechanism: Variable Rotational Direction

Figure 9:
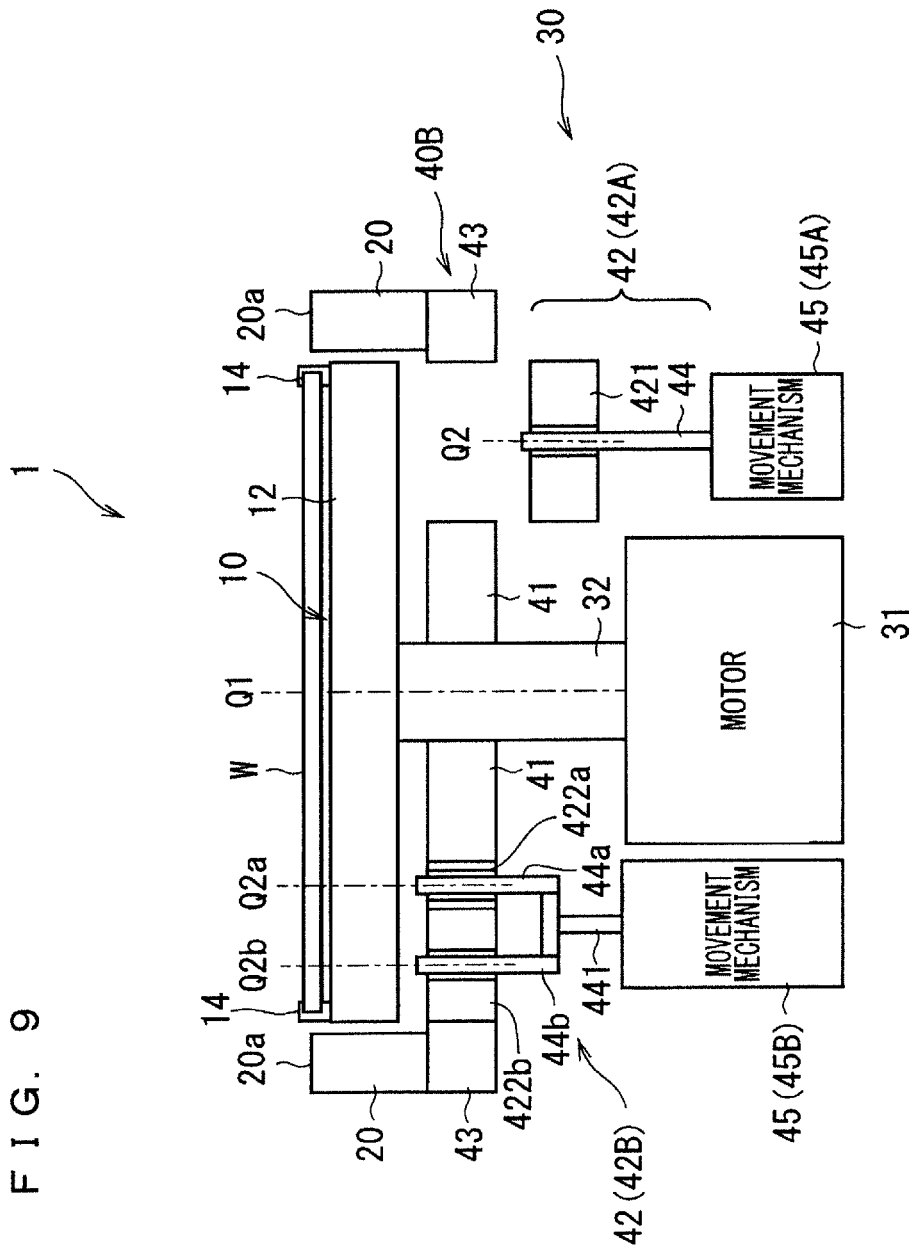
FIG. 9 is a view schematically showing an example of the configuration of the substrate holding apparatus.
Figure 10:
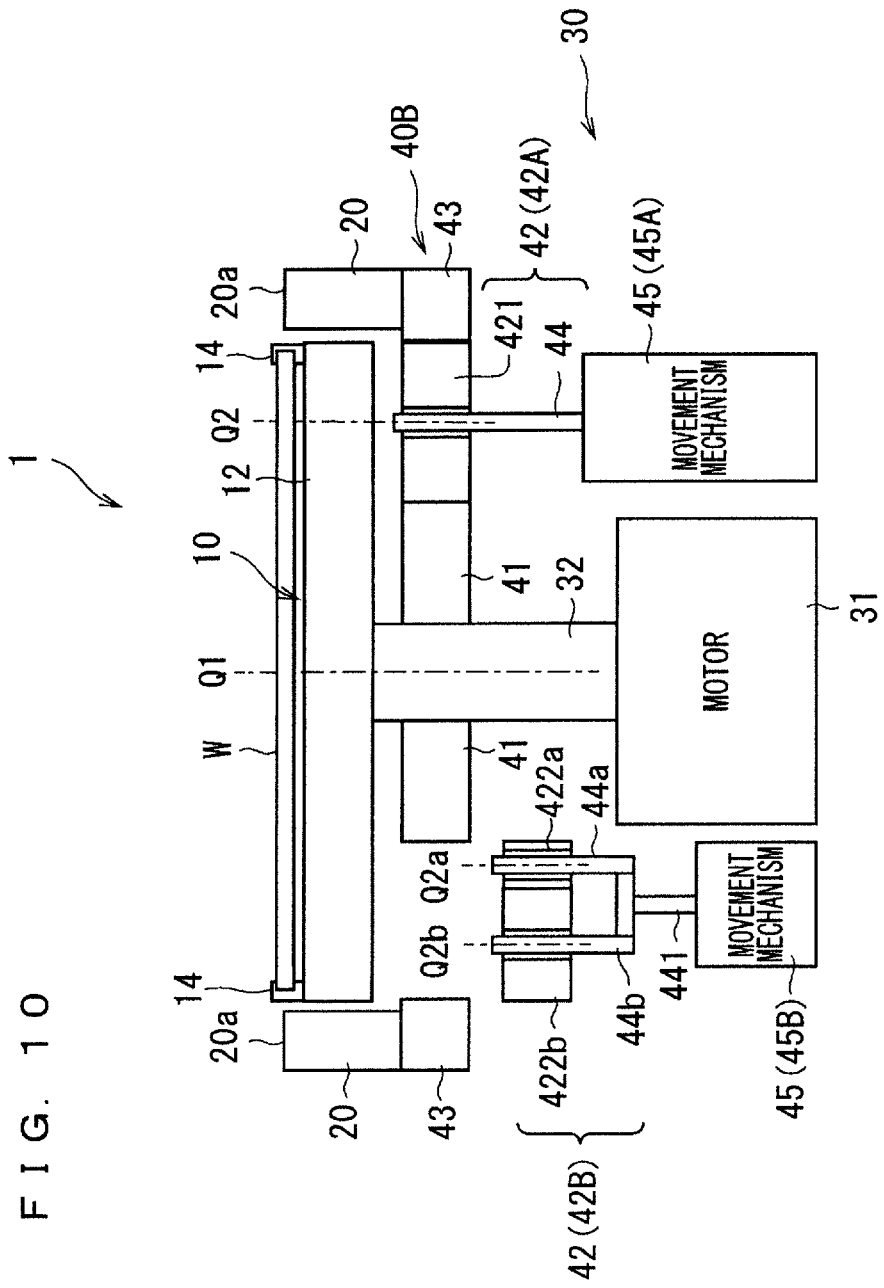
FIG. 10 is a view schematically showing an example of the configuration of the substrate holding apparatus.

The speed change mechanism 40 may vary the rotational direction of the ring member 20 depending on how high the holding speed of the holding member 10 is. In the example of FIG. 8, a speed change mechanism 40B is illustrated as the speed change mechanism 40 of the substrate processing apparatus 100A. FIGS. 9 and 10 are sectional views schematically showing an example of the configuration of the speed change mechanism 40B.

The speed change mechanism 40B rotates the ring member 20 in a variable rotational direction relative to the rotational direction of the holding member 10. More specifically, the speed change mechanism 40B in the example of FIGS. 9 and 10 includes the external gear 41, gear parts 42A and 42B, the internal gear 43, and movement mechanisms 45A and 45B for moving the respective gear parts 42A and 42B.

Both of the gear parts 42A and 42B are provided between the external gear 41 and the internal gear 43 as seen in plan view. That is, the gear parts 42A and 42B are provided in circumferentially different positions with respect to the rotation axis Q1. In the example of FIGS. 9 and 10, the gear parts 42A and 42B are provided on opposite sides with respect to the rotation axis Q1.

Each of the movement mechanisms 45A and 45B includes, for example, an air cylinder or a single-shaft stage, and is controlled by the controller 50. The movement mechanism 45A moves the gear part 42A between a position (referred to hereinafter as a first meshing position) in which the gear part 42A is positioned between the external gear 41 and the internal gear 43 and a position (referred to hereinafter as a first retracted position) in which the gear part 42A is retracted downwardly from between the external gear 41 and the internal gear 43. The gear part 42A in the first meshing position is in meshing engagement with the external gear 41 and the internal gear 43. When in meshing engagement, the gear part 42A rotates the internal gear 43, based on the rotation of the external gear 41.

The gear part 42B and the movement mechanism 45B operate similarly. Specifically, the movement mechanism 45B moves the gear part 42B between a position (referred to hereinafter as a second meshing position) in which the gear part 42B is positioned between the external gear 41 and the internal gear 43 and a position (referred to hereinafter as a second retracted position) in which the gear part 42B is retracted downwardly from between the external gear 41 and the internal gear 43. The gear part 42B in the second meshing position is in meshing engagement with the external gear 41 and the internal gear 43. When in meshing engagement, the gear part 42B rotates the internal gear 43, based on the rotation of the external gear 41.

In the example of FIGS. 9 and 10, the movement mechanisms 45A and 45B move the respective gear parts 42A and 42B in a vertical direction. Thus, it can be said that the movement mechanisms 45A and 45B are elevating mechanisms.

The controller 50 controls the movement mechanisms 45A and 45B to position one of the gear parts 42A and 42B between the external gear 41 and the internal gear 43 and to retract the other of the gear parts 42A and 42B downwardly from between the external gear 41 and the internal gear 43. This allows one of the gear parts 42A and 42B to contribute to the rotation of the internal gear 43 (i.e., the rotation of the ring member 20).

In the example of FIGS. 9 and 10, the gear part 42A includes the aforementioned external gear 421 and a shaft 44. The shaft 44 is disposed in an attitude such that the central axis thereof extends along the rotation axis Q2. The external gear 421 is rotatably coupled to the shaft 44. The movement mechanism 45A moves the shaft 44 upwardly and downwardly to thereby move the external gear 421 rotatably fixed to the shaft 44 upwardly and downwardly. The movement mechanism 45A is coupled to a lower end of the shaft 44.

In the example of FIGS. 9 and 10, the gear part 42B includes the aforementioned external gears 422a and 422b, shafts 44a and 44b, and a coupling member 441. The shafts 44a and 44b are disposed in an attitude such that the respective central axes thereof extend along the rotation axes Q2a and Q2b. The external gears 422a and 422b are rotatably coupled to the respective shafts 44a and 44b. The external gears 422a and 422b are in meshing engagement with each other. The movement mechanism 45B moves the shafts 44a and 44b upwardly and downwardly to thereby move the external gears 422a and 422b upwardly and downwardly. In the example of FIGS. 9 and 10, the shafts 44a and 44b are coupled to each other by the coupling member 441. The coupling member 441 is coupled to the movement mechanism 45B.

As illustrated in FIG. 9, the movement mechanism 45A moves the gear part 42A to the first retracted position, and the movement mechanism 45B moves the gear part 42B to the second meshing position, whereby the external gears 422a and 422b function as idle gears for transmitting the rotational force. At this time, as the motor 31 rotates, the speed change mechanism 40B rotates the ring member 20 in the same direction as the holding member 10.

As illustrated in FIG. 10, on the other hand, the movement mechanism 45A moves the gear part 42A to the first meshing position, and the movement mechanism 45B moves the gear part 42B to the second retracted position, whereby the external gear 421 functions as an idle gear for transmitting the rotational force. At this time, as the motor 31 rotates, the speed change mechanism 40B rotates the ring member 20 in the direction opposite to that of the holding member 10.

It would be good to perform switching between the gear parts 42A and 42B while the motor 31 stops the external gear 41 in a predetermined rotational position. In other words, the predetermined rotational position is a position in which the gear parts 42A and 42B are movable to the respective meshing positions.

Figure 11:
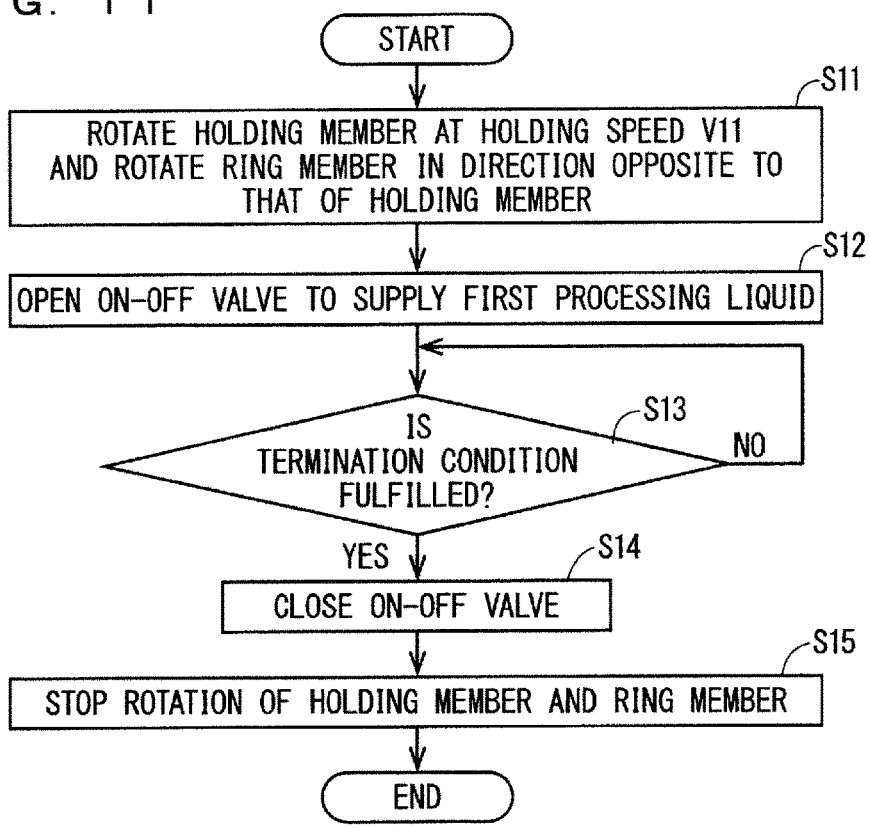
FIG. 11 is a flow diagram showing an example of the operation of the substrate processing apparatus.

FIG. 11 shows an example of the operation of the substrate processing apparatus 100A during the processing using the first processing liquid. At this time, the substrate W is held by the holding member 10. In Step S11, the controller 50 rotates the ring member 20 in the direction opposite to that of the holding member 10 while rotating the holding member 10 at the holding speed V11. More specifically, prior to the rotation of the holding member 10, the controller 50 controls the movement mechanisms 45A and 45B to move the gear part 42B to the second retracted position while moving the gear part 42A to the first meshing position. Next, the controller 50 rotates the motor 31 at the holding speed V11.

Next, in Step S12, the controller 50 opens the on-off valve 83 and closes the on-off valve 87 to supply the first processing liquid to the substrate W. After flowing over the front surface of the substrate W, the first processing liquid flows over the upper surface 20a of the ring member 20, and flies off toward the cup 60.

Next, in Step S13, the controller 50 judges whether a termination condition is fulfilled or not. For example, the controller 50 judges whether the amount of time elapsed from Step S13 is longer than a second predetermined time period or not. If a positive judgment is made, it may be judged that the termination condition is fulfilled. If it is judged that the termination condition is not fulfilled, the controller 50 executes Step S13 again. If the termination condition is fulfilled, the controller 50 closes the on-off valve 83 in Step S14 to terminate the supply of the first processing liquid. Next, in Step S15, the controller 50 stops the rotation of the holding member 10 and the ring member 20. Specifically, the controller 50 stops the rotation of the motor 31.

Figure 12:
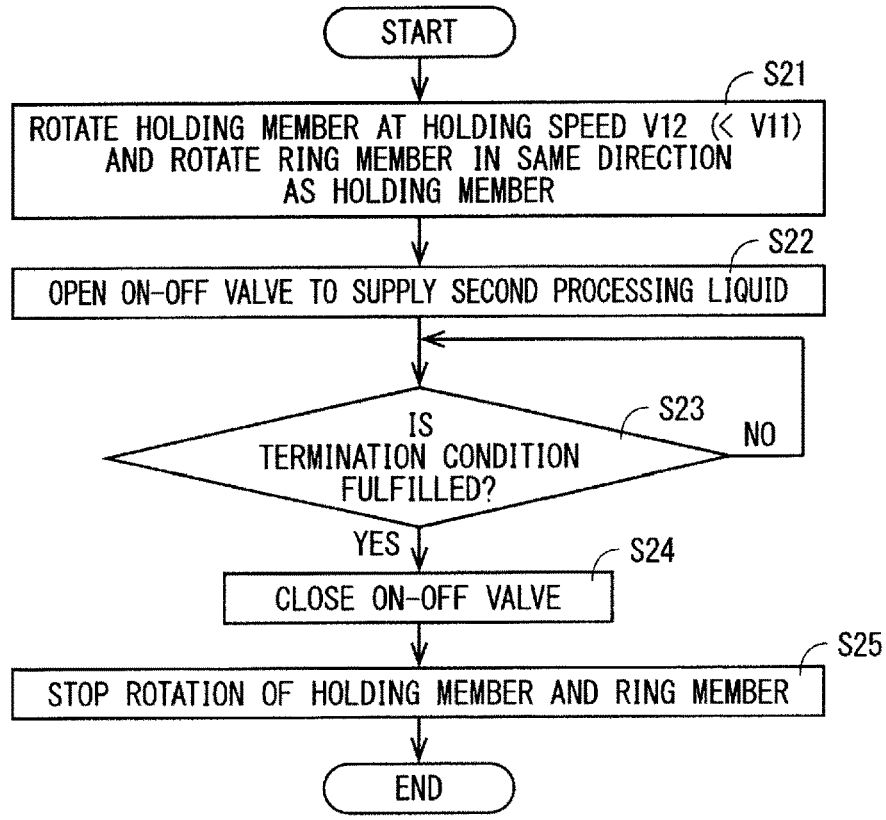
FIG. 12 is a flow diagram showing an example of the operation of the substrate processing apparatus.

FIG. 12 shows an example of the operation of the substrate processing apparatus 100A during the processing using the second processing liquid. At this time, the substrate W is held by the holding member 10. In Step S21, the controller 50 rotates the ring member 20 in the same direction as the holding member 10 while rotating the holding member 10 at the holding speed V12. More specifically, prior to the rotation of the holding member 10, the controller 50 controls the movement mechanisms 45A and 45B to move the gear part 42B to the second meshing position and to move the gear part 42A to the first retracted position. Next, the controller 50 rotates the motor 31 at the holding speed V12. The holding speed V12 is lower than the holding speed V11.

Next, in Step S22, the controller 50 closes the on-off valve 83 and opens the on-off valve 87 to supply the second processing liquid to the substrate W. After flowing over the front surface of the substrate W, the second processing liquid flows over the upper surface 20a of the ring member 20, and flies off toward the cup 60.

Next, in Step S23, the controller 50 judges whether a termination condition is fulfilled or not. For example, the controller 50 judges whether the amount of time elapsed from Step S23 is longer than a third predetermined time period or not. If a positive judgment is made, it may be judged that the termination condition is fulfilled. If it is judged that the termination condition is not fulfilled, the controller 50 executes Step S23 again. If the termination condition is fulfilled, the controller 50 closes the on-off valve 87 in Step S24 to terminate the supply of the second processing liquid. Next, in Step S25, the controller 50 stops the rotation of the holding member 10 and the ring member 20. Specifically, the controller 50 stops the rotation of the motor 31.

As described above, when supplying the first processing liquid to the substrate W while rotating the substrate W at the relatively high holding speed V11, the controller 50 rotates the ring member 20 in the direction opposite to that of the holding member 10 (FIG. 11). Thus, the flow velocity of the first processing liquid flying off from the outer peripheral edge of the ring member 20 is reduced more greatly, as compared with the flow velocity obtained when the holding member 10 and the ring member 20 rotate integrally. This reduces the flow velocity of the first processing liquid flying off from the outer peripheral edge of the ring member 20 to a suitable value or less to thereby suitably suppress the re-adhesion of the processing liquid to the substrate W.

On the other hand, when supplying the second processing liquid to the substrate W while rotating the substrate W at the relatively low holding speed V12, the controller 50 rotates the ring member 20 in the same direction as the holding member 10 (FIG. 12). Thus, the flow velocity of the second processing liquid flying off from the outer peripheral edge of the ring member 20 is reduced more slightly, as compared with the flow velocity obtained when the holding member 10 and the ring member 20 rotate integrally.

If the flow velocity of the processing liquid flowing over the upper surface 20a of the ring member 20 is too low, there are cases in which the processing liquid forms puddles on the upper surface 20a of the ring member 20. When the holding member 10 rotates at the relatively low holding speed V12, the flow velocity of the second processing liquid flowing onto the ring member 20 is relatively low. Thus, if the flow velocity of the second processing liquid is greatly reduced on the ring member 20, there is a likelihood that the second processing liquid forms puddles on the upper surface 20a of the ring member 20, for example, after the supply of the second processing liquid is stopped. This likelihood increases as the holding speed V12 decreases.

On the other hand, when the holding member 10 rotates at the relatively low holding speed V12 in the substrate processing apparatus 100A, the ring member 20 rotates in the same direction as the holding member 10, so that the ring member 20 reduces the flow velocity of the second processing liquid more slightly. This restrains the flow velocity of the processing liquid flying off from the outer peripheral edge of the ring member 20 from becoming too low. That is, this allows the processing liquid to suitably fly off from the upper surface 20a toward the cup 60, thereby suppressing the formation of puddles of the processing liquid on the upper surface 20a of the ring member 20.

Speed Change Mechanism: Variable Speed Ratio

In the aforementioned example, the speed change mechanism 40B rotates the ring member 20 in the variable rotational direction relative to the holding member 10. However, the speed change mechanism 40 may rotate the ring member 20 at a variable speed ratio relative to the holding member 10.

Figure 13:
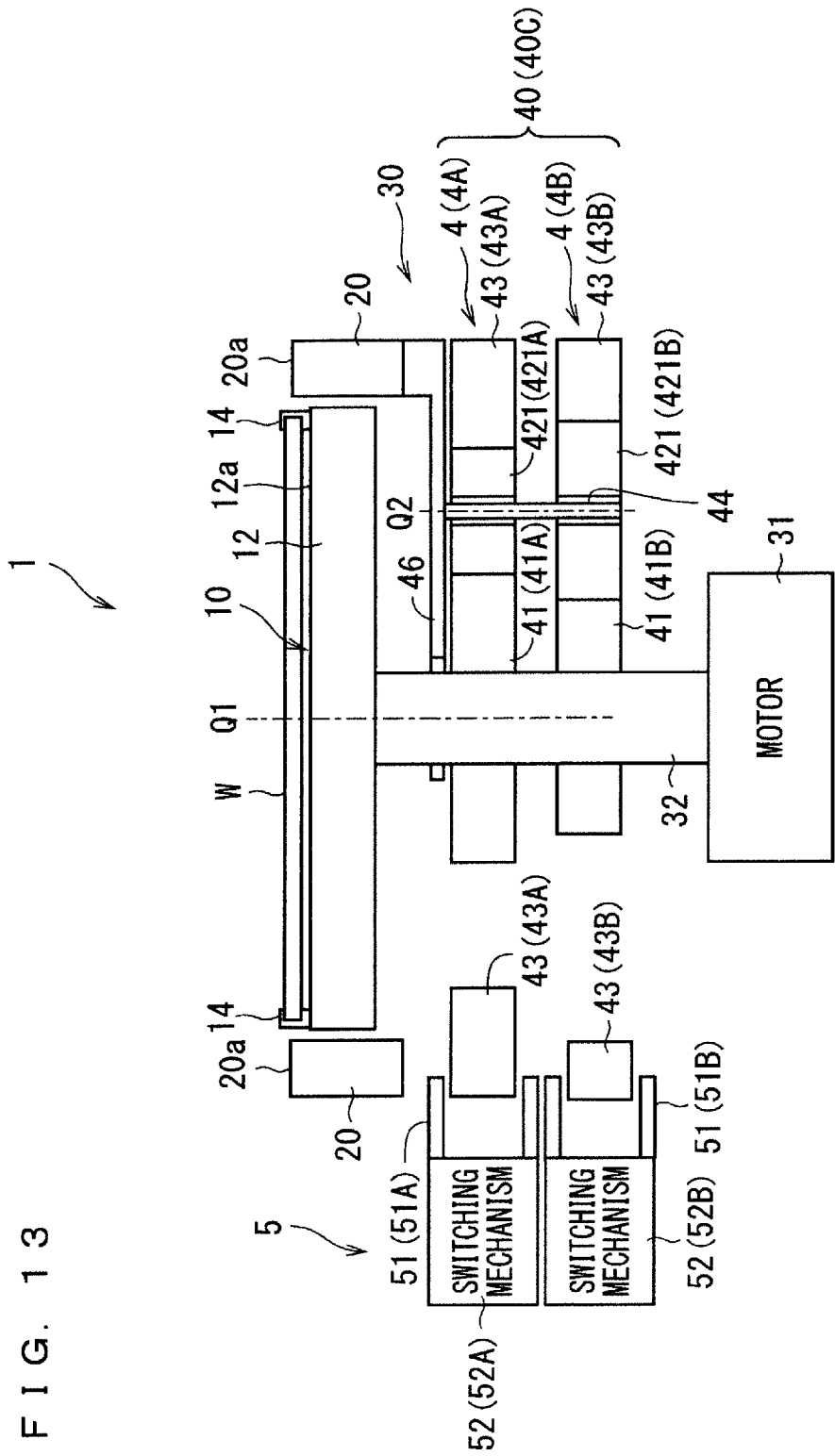
FIG. 13 is a view schematically showing an example of the configuration of the substrate processing apparatus.

FIG. 13 is a sectional view schematically showing an example of the configuration of a speed change mechanism 40C. The speed change mechanism 40C rotates the ring member 20 at a variable speed ratio to the rotation speed of the holding member 10. In the example of FIG. 13, the speed change mechanism 40B includes a plurality of planetary gear parts 4, a planetary carrier 46, and a selection part 5 for causing one of the planetary gear parts 4 to selectively function.

The planetary carrier 46 has a plate-like shape, and is disposed in an attitude such that the thickness direction thereof extends in a vertical direction. The planetary carrier 46 is rotatably coupled to the shaft 32, and is coupled to the lower surface of the ring member 20.

Each of the planetary gear parts 4 includes the external gears 41 and 421 and the internal gear 43. In the example of FIG. 13, two planetary gear parts 4A and 4B are provided as the planetary gear parts 4. For description, characters "A" and "B" are appended to the reference numerals of the external gears 41 and 421 and the internal gear 43. For example, external gears 41A and 421A and an internal gear 43A are the external gears 41 and 421 and the internal gear 43, respectively, which belong to the planetary gear part 4A. The same applies to the planetary gear part 4B.

The external gears 41A and 41B are coupled to the shaft 32 in respective different positions as seen in a vertical direction. In the example of FIG. 13, the external gears 41A and 41B are coupled under the planetary carrier 46 to the shaft 32. The external gears 41A and 41B rotate as the shaft 32 rotates.

Like the aforementioned internal gear 43, the internal gears 43A and 43B are opposed in spaced apart relation to the respective external gears 41A and 41B as seen in a radial direction with respect to the rotation axis Q1. It should be noted that the internal gears 43A and 43B are not coupled to the ring member 20. The internal gears 43A and 43B are fixed to the housing 70 so as to be able to rotate about the rotation axis Q1.

The external gear 421A is disposed between the external gear 41A and the internal gear 43A, and the external gear 421B is disposed between the external gear 41B and the internal gear 43B. The external gears 421A and 421B are rotatably fixed to the planetary carrier 46. In the example of FIG. 13, the shaft 44 is mounted to the planetary carrier 46. The shaft 44 extends vertically downwardly from a lower surface of the planetary carrier 46. The external gears 421A and 421B are rotatably coupled to the shaft 44.

The selection part 5 non-rotatably holds one of the internal gears 43 of the planetary gear parts 4, and freely rotates the other internal gear 43. For example, the selection part 5 includes a gripping part 51 for vertically gripping part of each of the internal gears 43 and a switching mechanism 52 for switching between gripping and release of the internal gears 43 by means of the gripping part 51. The gripping part 51 vertically grips each of the internal gears 43, whereby each of the internal gears 43 is non-rotatably held. On the other hand, the gripping part 51 releases each of the internal gears 43, whereby each of the internal gears 43 freely rotates about the rotation axis Q1. The term "release" as used herein indicates a situation in which the gripping part 51 does not grip each of the internal gears 43 but is spaced apart from each of the internal gears 43.

The gripping part 51 has a pair of plates for vertically gripping each of the internal gears 43 therebetween. The switching mechanism 52 adjusts the spacing between the pair of plates. For example, the switching mechanism 52 has a ball screw mechanism and the like. The switching mechanism 52 is controlled by the controller 50. In the example of FIG. 13, two gripping parts 51A and 51B are provided as the gripping part 51, and two switching mechanisms 52A and 52B are provided as the switching mechanism 52 because the two planetary gear parts 4A and 4B are provided.

The switching mechanism 52A causes the gripping part 51A to grip the internal gear 43A, and the switching mechanism 52B causes the gripping part 51B to release the internal gear 43B, whereby the planetary gear part 4A rotates the ring member 20. This will be described below in detail.

In the planetary gear part 4A, the external gear 41A rotates as the motor 31 rotates, and the external gear 421A revolves while rotating in response to the rotation of the external gear 41A. The planetary carrier 46 rotates about the rotation axis Q1 at the same speed as the speed of revolution of the external gear 421A, and rotates the ring member 20 at that speed (ring speed). The ring speed of the ring member 20 is determined by the speed ratio depending on the numbers Z1A and Z3A of teeth of the external and internal gears 41A and 43A and the holding speed of the holding member 10. Specifically, the ring speed V2 of the ring member 20 is equal to the product of the speed ratio expressed by Z1A/(Z1A+Z3A) and the holding speed V1 of the holding member 10. The ring speed V2 of the ring member 20 is lower than the holding speed V1 of the holding member 10 because this speed ratio is less than 1.

At this time, the external gear 421B and the internal gear 43B rotate freely in the planetary gear part 4B. Thus, while revolving as the planetary carrier 46 rotates, the external gear 421B rotates as the external gear 41B and the planetary carrier 46 rotate. The internal gear 43B rotates as the external gear 421B rotates and revolves. Thus, the planetary gear part 4B does not contribute to the rotation of the ring member 20 at this time.

On the other hand, the gripping part 51A releases the internal gear 43A and the gripping part 51B grips the internal gear 43B, whereby the planetary gear part 4B rotates the ring member 20. At this time, the planetary gear part 4A does not contribute to the rotation of the ring member 20.

The ring speed V2 of the ring member 20 is equal to the product of the speed ratio (=Z1B/(Z1B+Z3B)) depending on the number Z1B of teeth of the external gear 41B and the number Z3B of teeth of the internal gear 43B and the holding speed V1 of the holding member 10. The ring speed V2 of the ring member 20 is lower than the holding speed V1 of the holding member 10 because this speed ratio is less than 1.

The planetary gear parts 4 are different in speed ratio from each other. That is, the speed ratio (=Z1A/(Z1A+Z3A)) in the planetary gear part 4A is different from the first speed ratio (=Z1B/(Z1B+Z3B)) in the planetary gear part 4B. For example, the second speed ratio in the planetary gear part 4A is lower than the speed ratio in the planetary gear part 4B.

In such a substrate processing apparatus 100, the controller 50 controls the rotation mechanism 30 to rotate the ring member 20 at the first speed ratio when rotating the holding member 10 at the holding speed V11 and to rotate the ring member 20 at the second speed ratio higher than the first speed ratio when rotating the holding member 10 at the holding speed V12 lower than the holding speed V11. This will be described specifically below.

Figure 14:
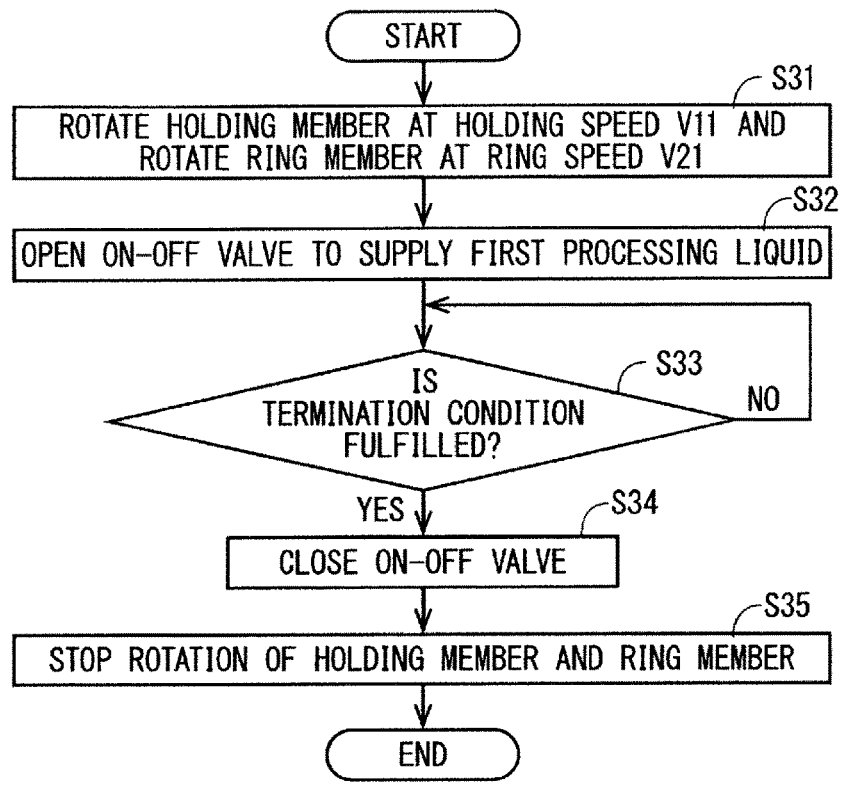
FIG. 14 is a flow diagram showing an example of the operation of the substrate processing apparatus.

FIG. 14 shows an example of the operation of the substrate processing apparatus 100A during the processing using the first processing liquid. At this time, the substrate W is held by the holding member 10. In Step S31, the controller 50 rotates the ring member 20 at a ring speed V21 while rotating the holding member 10 at the holding speed V11. Specifically, prior to the rotation of the motor 31, the controller 50 causes the selection part 5 to select the planetary gear part 4A. That is, the controller 50 controls the switching mechanisms 52A and 52B to cause the gripping part 51A to grip the internal gear 43A of the planetary gear part 4A and to cause the gripping part 51B to release the internal gear 43B of the planetary gear part 4B. Next, the controller 50 rotates the motor 31 at the holding speed V11. This allows the ring member 20 to rotate at the relatively low first speed ratio. For example, the holding speed V11 is approximately 1000 [rpm], and the ring speed V21 is approximately 200 [rpm] when the first speed ratio is 0.2.

Next, the controller 50 executes Steps S32 to S35. Steps S32 to S35 are identical with Steps S12 to S15, respectively.

Figure 15:
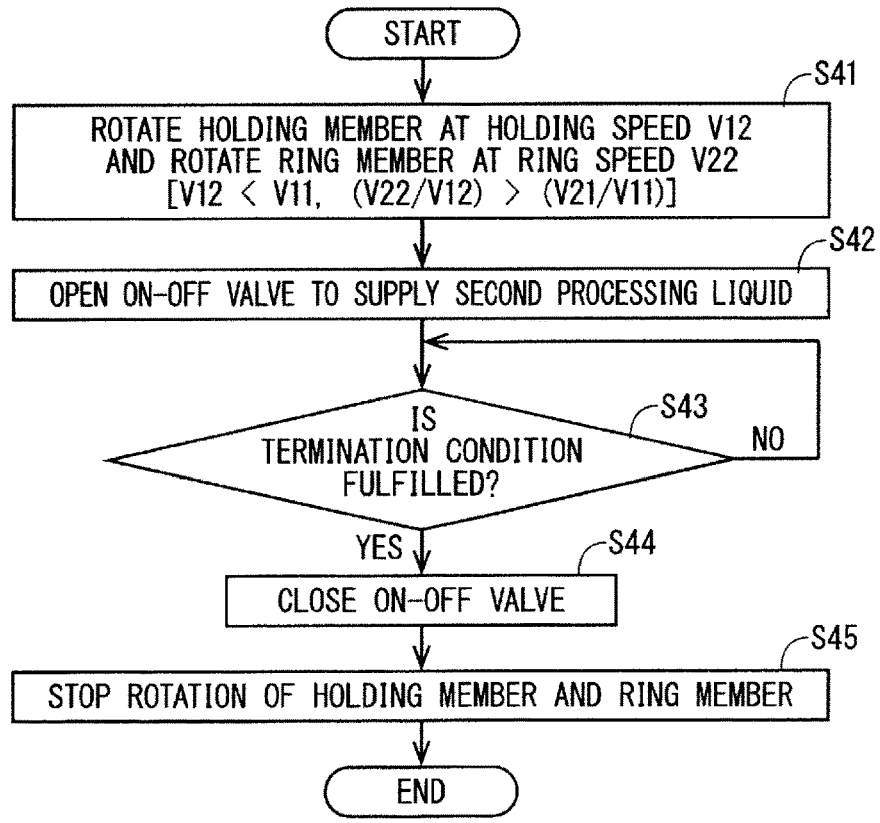
FIG. 15 is a flow diagram showing an example of the operation of the substrate processing apparatus.

FIG. 15 shows an example of the operation of the substrate processing apparatus 100A during the processing using the second processing liquid. At this time, the substrate W is held by the holding member 10. In Step S41, the controller 50 rotates the ring member 20 at a ring speed V22 while rotating the holding member 10 at the holding speed V12. Specifically, prior to the rotation of the motor 31, the controller 50 causes the selection part 5 to select the planetary gear part 4B. That is, the controller 50 controls the switching mechanisms 52A and 52B to cause the gripping part 51A to release the internal gear 43A and to cause the gripping part 51B to hold the internal gear 43B. Next, the controller 50 rotates the motor 31 at the holding speed V12. This allows the ring member 20 to rotate at the relatively high second speed ratio. For example, the holding speed V12 is approximately 200 [rpm], and the ring speed V22 is approximately 50 [rpm] when the second speed ratio is 0.4.

Next, the controller 50 executes Steps S42 to S45. Steps S42 to S45 are identical with Steps S22 to S25, respectively.

As described above, when supplying the first processing liquid to the substrate W while rotating the substrate W at the relatively high holding speed V11, the controller 50 rotates the ring member 20 at the relatively low first speed ratio to the holding speed V11 (FIG. 14). Thus, the flow velocity of the processing liquid is reduced more greatly, as compared with the flow velocity obtained when the holding member 10 and the ring member 20 rotate integrally. This reduces the flow velocity of the processing liquid flying off from the outer peripheral edge of the ring member 20 to a suitable value or less to thereby suitably suppress the re-adhesion of the processing liquid to the substrate W.

On the other hand, when supplying the second processing liquid to the substrate W while rotating the substrate W at the relatively low holding speed V12, the controller 50 rotates the ring member 20 at the relatively high second speed ratio to the holding speed V12 (FIG. 15). Thus, the flow velocity of the processing liquid is reduced more slightly, as compared with the flow velocity obtained when the holding member 10 and the ring member 20 rotate integrally. This restrains the flow velocity of the processing liquid flying off from the outer peripheral edge of the ring member 20 from becoming too low. That is, this allows the processing liquid to suitably fly off from the outer peripheral edge of the ring member 20 toward the cup 60, thereby suppressing the formation of puddles of the processing liquid on the upper surface 20a of the ring member 20.

Rotation Mechanism: Independent Control

In the aforementioned example, the rotation mechanism 30 includes the speed change mechanism 40. The ring speed of the ring member 20 is dependent on the holding speed of the holding member 10 because the speed change mechanism 40 rotates the ring member 20 based on the rotation of the holding member 10. The present invention, however, is not limited to this. The rotation mechanism 30 may be capable of independently controlling the rotation of the holding member 10 and the ring member 20.

Figure 16:
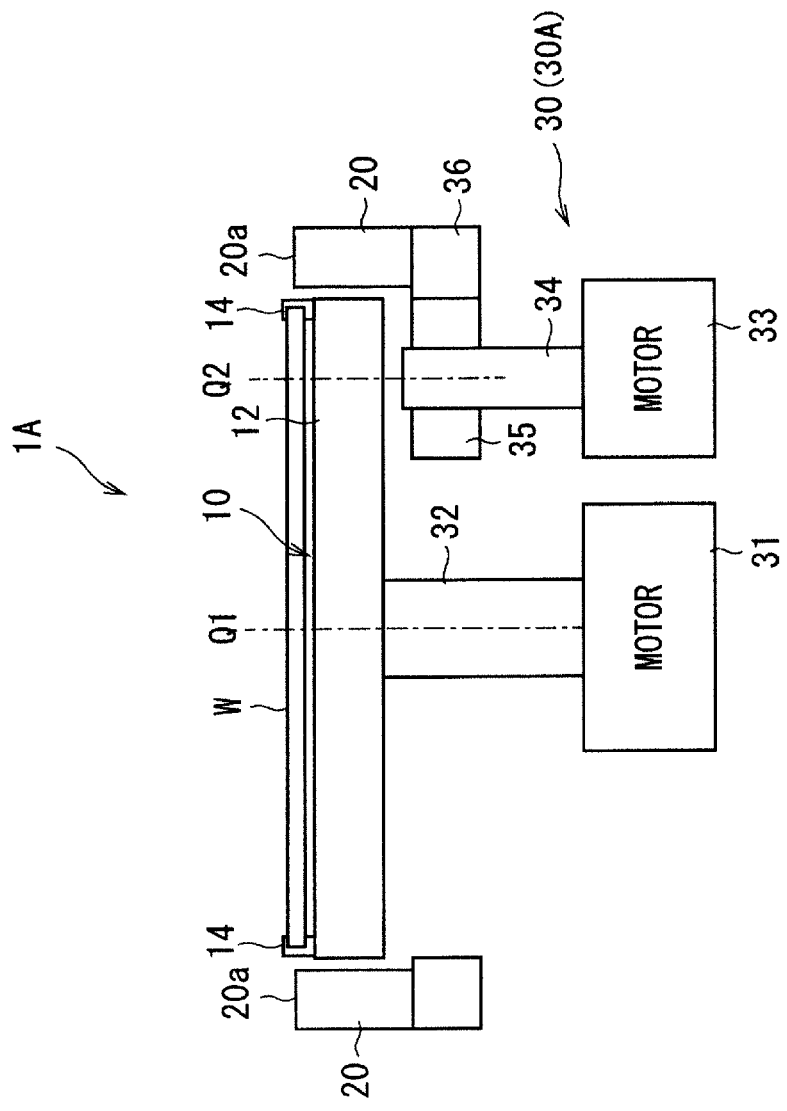
FIG. 16 is a view schematically showing an example of the configuration of the substrate holding apparatus.

FIG. 16 is a view schematically showing an example of the configuration of a substrate holding apparatus 1A. The substrate holding apparatus 1A differs from the substrate holding apparatus 1 of FIG. 3 in internal configuration of the rotation mechanism 30. A rotation mechanism 30A is shown in FIG. 16 as the rotation mechanism 30 of the substrate holding apparatus 1A. This rotation mechanism 30A includes the motor 31 for rotating the holding member 10 and a motor 33 for rotating the ring member 20. More specifically, the rotation mechanism 30A in the example of FIG. 16 further includes shafts 32 and 34, an external gear 35, and an internal gear 36.

The shaft 32 is coupled to the motor 31 and the holding member 10. The motor 31 is controlled by the controller 50 to rotate the shaft 32, thereby rotating the holding member 10.

The internal gear 36 is in a shape of a ring, and is disposed in an attitude such that the central axis thereof extends along the rotation axis Q1. The internal gear 36 is coupled to the lower surface of the ring member 20, and has a plurality of teeth formed on an inner peripheral surface of the internal gear 36 and arranged circumferentially about the rotation axis Q1. These teeth protrude radially inwardly with respect to the rotation axis Q1. Like the internal gear 43, the internal gear 36 may be formed integrally with the ring member 20 using the same material.

The external gear 35 is disposed in an attitude such that the thickness direction thereof extends in a vertical direction. The external gear 35 is disposed rotatably about the rotation axis Q2. The external gear 35 has a plurality of teeth formed on an outer peripheral surface of the external gear 35 and arranged circumferentially about the rotation axis Q2. These teeth protrude radially outwardly with respect to the rotation axis Q2. The external gear 35 is positioned so as to mesh with the internal gear 36.

The shaft 34 has a cylindrical shape extending in a vertical direction, and is disposed so that the central axis thereof extends along the rotation axis Q2. The shaft 34 is coupled to the external gear 35 and the motor 33.

The motor 33 is controlled by the controller 50. The motor 33 rotates the shaft 34 about the rotation axis Q2, whereby the external gear 35 rotates about the rotation axis Q2. The internal gear 36 rotates about the rotation axis Q1 as the external gear 35 rotates. Thus, the ring member 20 coupled to the internal gear 36 also rotates about the rotation axis Q2.

As mentioned above, the rotation mechanism 30A includes the motor 31 for rotating the holding member 10 and the motor 33 for rotating the ring member 20 to thereby control the rotation of the holding member 10 and the ring member 20 independently of each other.

For example, the controller 50 is capable of controlling the motors 31 and 33 to rotate the ring member 20 at the ring speed lower than the holding speed of the holding member 10. This reduces the flow velocity of the processing liquid flying off from the outer peripheral edge of the ring member 20 to thereby suppress the re-adhesion of the processing liquid to the substrate W.

The controller 50 may control the motors 31 and 33 to rotate the ring member 20 in the same direction as the holding member 10. This makes turbulence in flows of the processing liquid less liable to occur on the upper surface 20a of the ring member 20, as in the speed change mechanism 40A.

Also, the controller 50 may control the motors 31 and 33 to rotate the ring member 20 in the direction opposite to that of the holding member 10. This further reduces the flow velocity of the processing liquid flying outwardly from the ring member 20 to thereby further suppress the re-adhesion of the processing liquid to the substrate W.

The controller 50 is capable of controlling the motors 31 and 33 to control the rotation of the holding member 10 and the ring member 20 independently of each other. Thus, the controller 50 is capable of controlling the speed ratio between the holding speed of the holding member 10 and the ring speed of the ring member 20 to any value.

The controller 50 may control the motors 31 and 33 to rotate the ring member 20 at the first speed ratio when rotating the holding member 10 at the holding speed V11 and to rotate the ring member 20 at the second speed ratio higher than the first speed ratio when rotating the holding member 10 at the holding speed V12 lower than the holding speed V11. This allows the suitable control of the flow velocity of the processing liquid flying off from the outer peripheral edge of the ring member 20 as in the speed change mechanism 40C to thereby suppress the re-adhesion of the processing liquid to the substrate W and the formation of puddles of the processing liquid on the ring member 20.

The controller 50 is capable of controlling the motors 31 and 33 to control the rotational directions of the holding member 10 and the ring member 20 to any direction. The controller 50 may rotate the ring member 20 in the direction opposite to that of the holding member 10 when rotating the holding member 10 at the holding speed V11 and to rotate the ring member 20 in the same direction as the holding member 10 when rotating the holding member 10 at the holding speed V12 lower than the holding speed V11. This allows the suitable control of the flow velocity of the processing liquid flying off from the outer peripheral edge of the ring member 20 as in the speed change mechanism 40B to thereby suppress the re-adhesion of the processing liquid to the substrate W and the formation of puddles of the processing liquid on the ring member 20.

Magnitude Relationship Between Rotation Speeds of Holding Member and Ring Member In the aforementioned example, the rotation mechanism 30 rotates the ring member 20 at the ring speed lower than the holding speed of the holding member 10. The present invention, however, is not limited to this. If the holding speed of the holding member 10 is very low and the ring member 20 is rotated at a speed lower than that of the holding speed, the likelihood of the formation of puddles of the processing liquid on the upper surface 20a of the ring member 20 increases. Thus, the ring speed of the ring member 20 may be controlled to become higher than the holding speed of the holding member 10 if the holding speed of the holding member 10 is very low. This causes greater centrifugal force to act on the processing liquid on the upper surface 20a of the ring member 20, thereby causing the processing liquid to fly outwardly from the ring member 20. Thus, the formation of puddles of the processing liquid on the upper surface 20a of the ring member 20 is suppressed.

In short, it is only necessary that the rotation mechanism 30 rotates the ring member 20 at a different rotation speed and/or in a different rotational direction from the holding member 10. Thus, the flow velocity of the processing liquid is adjusted by the rotation of the ring member 20 different from the rotation of the holding member 10.

Change in Speed Ratio in Accordance with Rotation Speed of Holding Member

For example, the controller 50 may rotate the ring member 20 at the first speed ratio of less than 1 to the holding speed V1 when the holding speed V1 of the holding member 10 is higher than a first reference value; rotate the ring member 20 at the second speed ratio higher than the first speed ratio to the holding speed V1 when the holding speed V1 of the holding member 10 is lower than the first reference value and higher than a second reference value; and rotate the ring member 20 at a third speed ratio of greater than 1 to the holding speed V1 when the holding speed V1 of the holding member 10 is lower than the second reference value. Thus, the flow velocity of the processing liquid flying off from the outer peripheral edge of the ring member 20 is adjusted to within a desired range.

Flow Rate

The re-adhesion of the processing liquid to the substrate W due to liquid splashes and the formation of puddles of the processing liquid on the upper surface 20a of the ring member 20 are less liable to occur when the flow rate of the processing liquid is low than when the flow rate of the processing liquid is high. This flow rate is set to a value suitable for the processing liquid to act on the substrate W. The flow rate is controlled by the flow regulating valve 84 and the like.

For example, the controller 50 may control the rotation speed of the holding member 10 and the rotation speed of the ring member 20 to the same speed when supplying a certain processing liquid at a flow rate lower than a reference flow rate value and control the speed ratio in the aforementioned manner in accordance with the rotation speed of the holding member 10 when supplying a different processing liquid at a flow rate higher than the reference flow rate value.

Ring Member: Upper Surface

Figure 17:
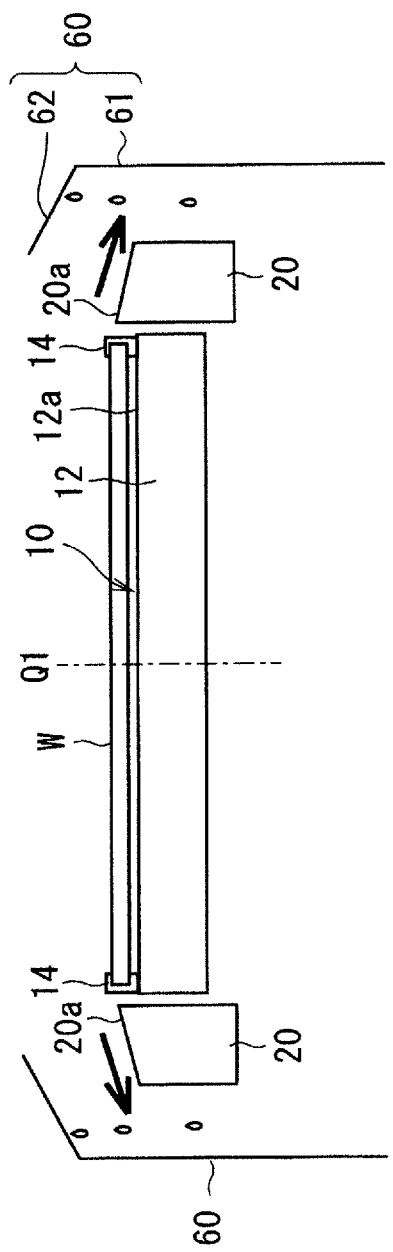
FIG. 17 is a view schematically showing an example of the configuration of the substrate holding apparatus.

FIG. 17 is a sectional view schematically showing an example of the configuration of the holding member 10 and the ring member 20. In the example of FIG. 17, the upper surface 20a of the ring member 20 is inclined with respect to a horizontal plane. More specifically, the upper surface 20a of the ring member 20 is inclined with respect to a horizontal plane so that an outer peripheral edge thereof is positioned below an inner peripheral edge thereof. In other words, the upper surface 20a of the ring member 20 is inclined so as to approach the floor surface of the housing 70 in a radially outward direction with respect to the rotation axis Q1.

The ring member 20 is disposed so that the inner peripheral edge at the uppermost position of the upper surface 20a is positioned below the front surface of the substrate W. More specifically, the vertical position of the ring member 20 is set so that the inner peripheral edge of the upper surface 20a is below the front surface of the substrate W and the processing liquid flying off from the front surface of the substrate W flows over the upper surface 20a of the ring member 20. In the example of FIG. 17, the ring member 20 is provided so that the vertical position of the inner peripheral edge of the upper surface 20a is level with the vertical position of the upper surface 12a of the base member 12.

In the example of FIG. 17, the processing liquid easily flows over the upper surface 20a of the ring member 20 toward the outer peripheral edge thereof because the upper surface 20a of the ring member 20 is inclined as mentioned above. Flows of the processing liquid are indicated by thick arrows in the example of FIG. 17.

According to this ring member 20, the processing liquid flies outwardly from the outer peripheral edge positioned below the inner peripheral edge of the ring member 20. That is, the processing liquid flies off from a lower position toward the cup 60. In addition, the direction in which the processing liquid flies off is inclined vertically downwardly from the horizontal direction. Thus, the processing liquid collides at a lower position with the inner peripheral surface of the cup 60. Thus, the processing liquid, if splashed back from the inner peripheral surface of the cup 60, is less liable to adhere to the substrate W again. If the processing liquid adhering to the inner surface of the overhang part 61 of the cup 60 falls in the form of droplets and the processing liquid flying off from the ring member 20 collides with the falling droplets, the processing liquid collides at a lower position with the droplets. Thus, the processing liquid is less liable to adhere to the substrate W again if splashed back from the droplets.

Ring Member: Quality of Upper Surface

The upper surface 20a of the ring member 20 may have a hydrophilicity. The term "hydrophilicity" as used herein refers to a contact angle of not greater than 30 degrees, for example. For example, the ring member 20 may be made of a hydrophilic material (e.g., quartz). In this case, the upper surface 20a of the ring member 20 also has a hydrophilicity.

Alternatively, the upper surface 20a of the ring member 20 may be subjected to a hydrophilization treatment. That is, the upper surface 20a of the ring member 20 may have a hydrophilic coating. In this case, the upper surface 20a of the ring member 20 also has a hydrophilicity.

Alternatively, when the ring member 20 is, for example, made of a resin, a hydrophilic group may be imparted to the upper surface 20a of the ring member 20 by irradiating the upper surface 20a of the ring member 20 with plasma or ultraviolet light. In this case, the upper surface 20a of the ring member 20 also has a hydrophilicity.

When the upper surface 20a of the ring member 20 has a hydrophilicity, the processing liquid is less liable to splash from the ring member 20 even when the processing liquid adheres to the upper surface 20a of the ring member 20. That is, the processing liquid easily flows along the upper surface 20a of the ring member 20. If the processing liquid is splashed upwardly from the upper surface 20a of the ring member 20, the splashed processing liquid is further splashed back from the inner peripheral surface of the cup 60 or from the falling droplets to easily return to the substrate W. The upper surface 20a of the ring member 20 which has a hydrophilicity enables the processing liquid to easily flow along the upper surface 20a of the ring member 20, thereby suppressing the re-adhesion of the processing liquid to the substrate W.

Opposed Surfaces of Holding Member and Ring Member

A side surface 10a of the holding member 10 and an inner peripheral surface 20b of the ring member 20 are opposed to each other with a radial gap with respect to the rotation axis Q1 therebetween (with reference also to FIG. 1). Thus, it can be said that the side surface 10a and the inner peripheral surface 20b are opposed surfaces. At least one of the side surface 10a of the holding member 10 and the inner peripheral surface 20b of the ring member 20 may have a hydrophobicity. The term "hydrophobicity" as used herein refers to a contact angle of not less than 30 degrees, for example.

For example, at least one of the holding member 10 and the ring member 20 may be made of a hydrophobic material. Alternatively, at least one of the side surface 10a of the holding member 10 and the inner peripheral surface 20b of the ring member 20 may be subjected to a hydrophobization treatment (e.g., fluororesin coating). In other words, at least one of the side surface 10a of the holding member 10 and the inner peripheral surface 20b of the ring member 20 may have a hydrophobic coating.

This causes at least one of the side surface 10a of the holding member 10 and the inner peripheral surface 20b of the ring member 20 to repel the processing liquid. It is hence difficult for the processing liquid to enter the gap between the holding member 10 and the ring member 20. Thus, the amount of processing liquid flowing out to the rotation mechanism 30 is reduced.

The gap between the holding member 10 and the ring member 20 may be sealed. This further suppresses or avoids the processing liquid entering the gap.

Protective Member

Figure 18:
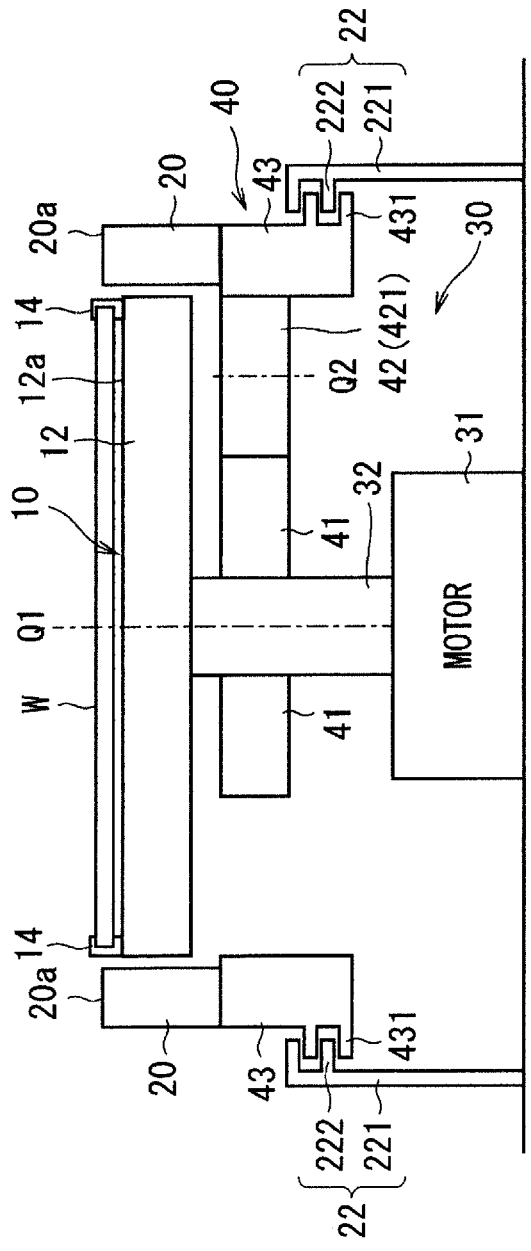
FIG. 18 is a view schematically showing an example of the configuration of the substrate holding apparatus.

FIG. 18 is a sectional view schematically showing an example of the configuration of a substrate holding apparatus 1B. The substrate holding apparatus 1B differs from the substrate holding apparatus 1 of FIG. 1 in the presence/absence of a protective member 22.

The protective member 22 has a tubular shape, and is provided in an attitude such that the central axis thereof extends in a vertical direction. This protective member 22 is provided so as to surround the ring member 20 as seen in plan view. Thus, the ring member 20 and the rotation mechanism 30 are disposed inside the protective member 22.

More specifically, the protective member 22 includes a tubular member 221 and protrusions 222. The tubular member 221 is a member surrounding the ring member 20 as seen in plan view, and is fixed to the floor surface of the housing 70, for example. Thus, the rotation mechanism 30 is disposed inside the protective member 22.

The protrusion 222 are formed in vertically different positions on an inner peripheral surface of an upper portion of the tubular member 221. The protrusion 222 protrude radially inwardly with respect to the rotation axis Q1, and extend circumferentially about the rotation axis Q1. For example, the protrusion 222 extend around the entire circumference of the inner peripheral surface of the tubular member 221.

In the example of FIG. 18, a plurality of protrusions 431 are formed in vertically different positions on a side surface of the rotation mechanism 30 (more specifically, an outer peripheral surface of the internal gear 43 of the speed change mechanism 40). The protrusions 431 protrude radially outwardly with respect to the rotation axis Q1, and extend circumferentially about the rotation axis Q1. For example, the protrusions 431 extend around the entire circumference of the outer peripheral surface of the internal gear 43.

The protrusion 222 of the protective member 22 are provided in positions vertically displaced from the protrusions 431 of the internal gear 43. The protective member 22 is disposed so that one of the protrusion 222 enters a gap between the protrusions 431 and one of the protrusions 431 enters a gap between the protrusion 222. In the example of FIG. 18, the protective member 22 is provided with two protrusion 222, and the internal gear 43 is provided with two protrusions 431. In the example of FIG. 18, the lower one of the two protrusion 222 enters the gap between the two protrusions 431, and the upper one of the two protrusions 431 enters the gap between the two protrusion 222. That is, the protrusion 222 and 431 are opposed to each other in a vertical direction. The protective member 22, which is spaced apart from the internal gear 43, does not interfere with the rotation of the internal gear 43. The ring member 20 and the holding member 22 have what is called a labyrinth seal structure.

According to this, it is difficult for the processing liquid flying off from the outer peripheral edge of the ring member 20 to pass through the gap between the rotation mechanism 30 (more specifically, the internal gear 43) and the protective member 22. This suppresses or avoids the processing liquid flowing out to the rotation mechanism 30.

In the aforementioned example, the protrusions 431 are provided on the outer peripheral surface of the internal gear 43. The present invention, however, is not limited to this. Protrusions may be provided on an outer peripheral surface of the ring member 20, and the protective member 22 may be disposed so that the protrusions enter gaps between the protrusion 222.

Back Surface Processing

In the aforementioned example, the processing liquid supply part 80 supplies the processing liquid to the front surface of the substrate W. However, a processing liquid supply part for supplying a processing liquid to the back surface of the substrate W may be provided.

Figure 19:
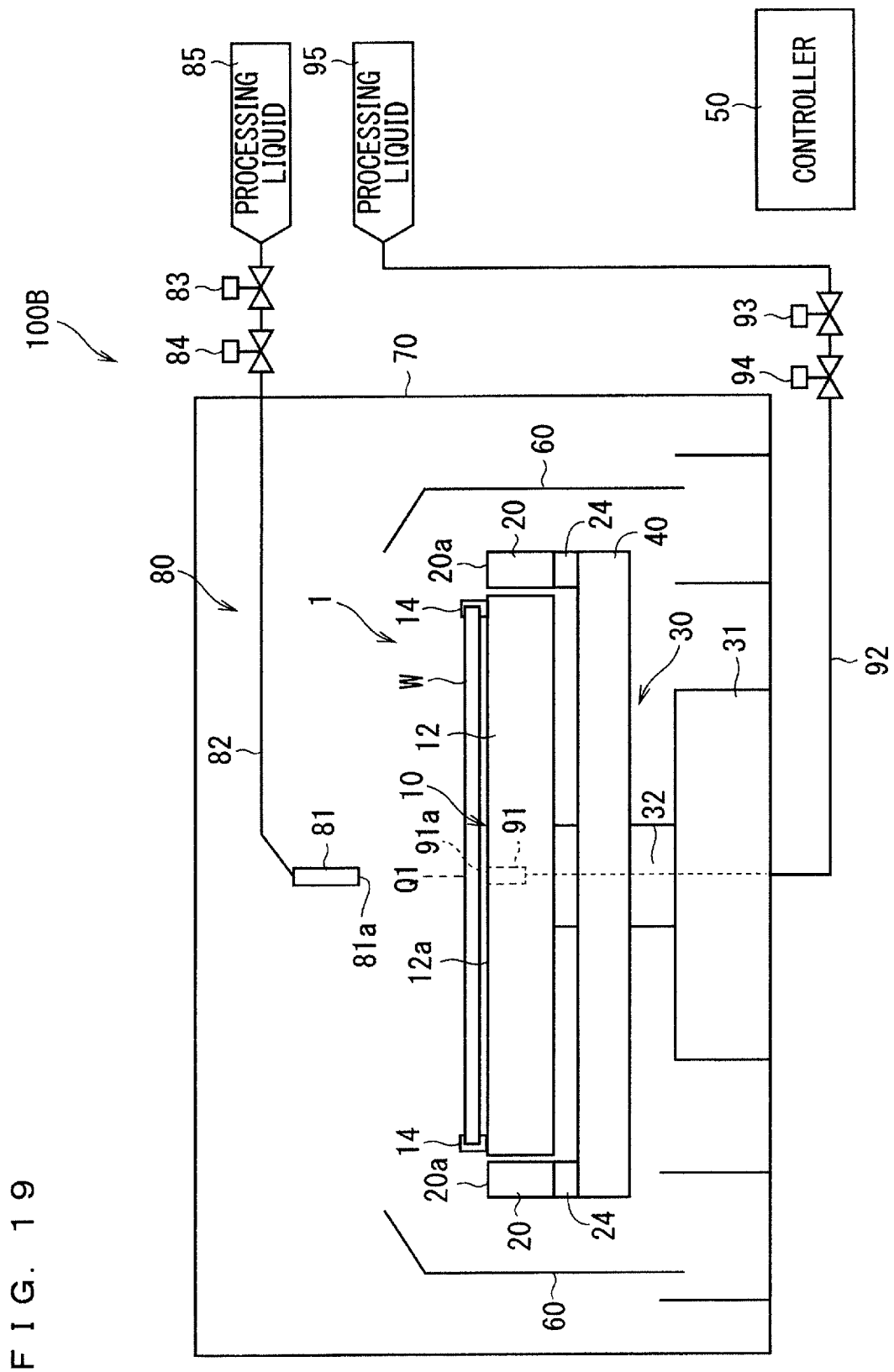
FIG. 19 is a view schematically showing an example of the configuration of the substrate processing apparatus.

FIG. 19 is a view schematically showing an example of the configuration of a substrate processing apparatus 100B. This substrate processing apparatus differs from the substrate processing apparatus 100 of FIG. 1 in the presence/absence of a processing liquid supply part 90 and an elevating mechanism 24.

The processing liquid supply part 90 supplies a processing liquid to the back surface of the substrate W. More specifically, the processing liquid supply part 90 includes a nozzle 91, a pipe 92, an on-off valve 93, and a flow regulating valve 94. The nozzle 91 having an orifice 91a is disposed in an attitude such that the orifice 91a is oriented upwardly. The pipe 92 has a first end coupled to the nozzle 91 and a second end coupled to a processing liquid supply source 95.

In the example of FIG. 19, the motor 31 is a hollow motor having a through hole extending therethrough in a vertical direction. The shaft 32 has a tubular shape. That is, the shaft 32 has a through hole extending therethrough in a vertical direction. The holding member 10 (specifically, the base member 12) also has a through hole extending therethrough in a vertical direction. The through holes formed in the motor 31, the shaft 32, and the holding member 10 are in communication with each other, and extend collectively in a vertical direction. The nozzle 91 and part of the pipe 92 pass through the motor 31, the shaft 32, and the holding member 10 in a vertical direction. The orifice 91a of the nozzle 91 is opposed to the back surface of the substrate W.

The on-off valve 93 is interposed in the pipe 92. By opening the on-off valve 93, the processing liquid from the processing liquid supply source 95 flows through the interior of the pipe 92 and is ejected from the orifice 91a of the nozzle 91. By closing the on-off valve 93, the ejection of the processing liquid from the orifice 91a of the nozzle 91 is stopped. The flow regulating valve 94 is interposed in the pipe 92. The flow regulating valve 94 regulates the amount of processing liquid flowing through the interior of the pipe 92.

While rotating the holding member 10, the controller 50 opens the on-off valve 93. Thus, the processing liquid supplied from the orifice 91a of the nozzle 91 to the back surface of the substrate W is subjected to centrifugal force resulting from the rotation of the substrate W to spread radially outwardly with respect to the rotation axis Q1. The processing liquid flows outwardly from a peripheral edge on the back surface side of the substrate W, and subsequently flows over the upper surface 20a of the ring member 20.

The processing liquid flowing over the back surface of the substrate W flows outwardly from the peripheral edge of the substrate W in a lower position than the processing liquid flowing over the front surface of the substrate W. Thus, the vertical position of the ring member 20 relative to the substrate W may be changed in accordance with a target surface (the front surface or the back surface) of the substrate W over which the processing liquid flows.

To this end, the elevating mechanism 24 is provided in the substrate processing apparatus 100B. The elevating mechanism 24 moves the ring member 20 upwardly and downwardly relative to the holding member 10. For example, the elevating mechanism 24 is provided between the ring member 20 and the internal gear 43. The elevating mechanism 24 includes, for example, an air cylinder or a single-shaft stage, and moves the ring member 20 upwardly and downwardly. This elevating mechanism 24 is controlled by the controller 50.

When supplying the processing liquid to the front surface of the substrate W, the controller 50 controls the elevating mechanism 24 to move the ring member 20 to a first position to be described next. The first position is a position in which the upper surface 20a of the ring member 20 is vertically below the front surface of the substrate W and in which the processing liquid flying off from the outer peripheral edge on the front surface side of the substrate W flows over the upper surface 20a of the ring member 20. For example, a position lying between the front surface of the substrate W and the upper surface 12a of the base member 12 may be used as the first position.

The controller 50 operates in a manner to be described below when supplying the processing liquid to the front surface of the substrate W. The controller 50 controls the elevating mechanism 24 to stop the ring member 20 at the first position, and causes the processing liquid supply part 80 to supply the processing liquid to the front surface of the substrate W while causing the rotation mechanism 30 to rotate the holding member 10 and the ring member 20.

On the other hand, when supplying the processing liquid to the back surface of the substrate W, the controller 50 controls the elevating mechanism 24 to move the ring member 20 to a second position to be described next. The second position is a position in which the upper surface 20a of the ring member 20 is below the upper surface 12a of the base member 12, and is below the first position. The second position is set to a position in which the processing liquid flowing outwardly from the outer peripheral edge on the back surface side of the substrate W flows over the upper surface 20a of the ring member 20. For example, the second position lies a distance equal to the thickness of the substrate W below the first position.

The controller 50 operates in a manner to be described below when supplying the processing liquid to the back surface of the substrate W. The controller 50 controls the elevating mechanism 24 to stop the ring member 20 at the second position, and causes the processing liquid supply part 90 to supply the processing liquid to the front surface of the substrate W while causing the rotation mechanism 30 to rotate the holding member 10 and the ring member 20.

Figure 20:
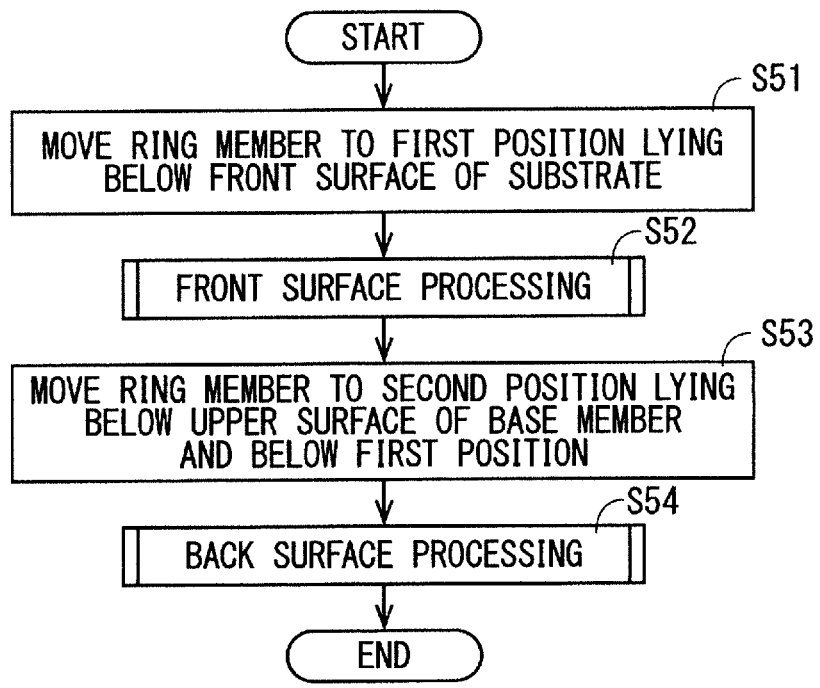
FIG. 20 is a flow diagram showing an example of the operation of the substrate processing apparatus.

FIG. 20 is a flow diagram showing an example of the operation of the substrate processing apparatus 100B. An example of the operation of performing the back surface processing on the back surface of the substrate W subsequently to the front surface processing on the front surface thereof is illustrated in the example of FIG. 20. At this time, the substrate W is held by the holding member 10. In Step S51, the controller 50 initially controls the elevating mechanism 24 to move the ring member 20 to the first position. Next, in Step S52, the controller 50 performs the front surface processing. Specifically, the controller 50 rotates the motor 31, and opens the on-off valve 83. This allows the processing liquid to be supplied to the entire front surface of the substrate W. Then, when a termination condition about the front surface processing is fulfilled, the controller 50 closes the on-off valve 83 to terminate the supply of the processing liquid to the front surface of the substrate W. For example, the fact that the amount of time elapsed since the on-off valve 83 was opened exceeds a fifth predetermined time period may be used as the termination condition.

Next, in Step S53, the controller 50 controls the elevating mechanism 24 to move the ring member 20 to the second position. Next, in Step S54, the controller 50 performs the back surface processing. Specifically, the controller 50 rotates the motor 31, and opens the on-off valve 93. This allows the processing liquid to be supplied to the entire back surface of the substrate W. Then, when a termination condition about the back surface processing is fulfilled, the controller 50 closes the on-off valve 93 to terminate the supply of the processing liquid to the back surface of the substrate W. Next, the controller 50 stops the rotation of the motor 31. For example, the fact that the amount of time elapsed since the on-off valve 93 was opened exceeds a sixth predetermined time period may be used as the termination condition.

According to the substrate processing apparatus 100B as described above, the vertical position of the ring member 20 relative to the holding member 10 is set at a higher position when the processing liquid flies off at a higher position from the peripheral edge of the substrate W.

If the second position is used as the vertical position of the ring member 20 for the front surface processing, the processing liquid flying off from the peripheral edge on the front surface side of the substrate W can adhere to a radially outer region of the upper surface 20a of the ring member 20. In this case, the processing liquid does not entirely flow from the inner peripheral edge of the upper surface 20a of the ring member 20 to the outer peripheral edge thereof, but flows from an intermediate region of the upper surface 20a to the outer peripheral edge thereof. In this case, the force exerted on the processing liquid by the ring member 20 can be decreased.

The use of the first position lying above the second position as the position of the ring member 20 for the front surface processing allows the processing liquid flying off from the peripheral edge on the front surface side of the substrate W to suitably flow, for example, from the inner peripheral edge of the upper surface 20a of the ring member 20 to the outer peripheral edge thereof. This increases the force exerted on the processing liquid by the ring member 20 to achieve the suitable control of the flow velocity of the processing liquid.

On the other hand, the second position is used as the position of the ring member 20 for the back surface processing. If the first position is used as the position of the ring member 20 for the back surface processing, the processing liquid flowing outwardly from the peripheral edge on the back surface side of the substrate W can collide with the inner peripheral surface of the ring member 20.

The use of the second position as the position of the ring member 20 allows the processing liquid flowing outwardly from the peripheral edge on the back surface side of the substrate W to suitably flow from the inner peripheral edge of the upper surface 20a of the ring member 20 to the outer peripheral edge thereof. This achieves the suitable control of the flow velocity of the processing liquid.

Position of Upper Surface of Ring Member 20

Figure 21:
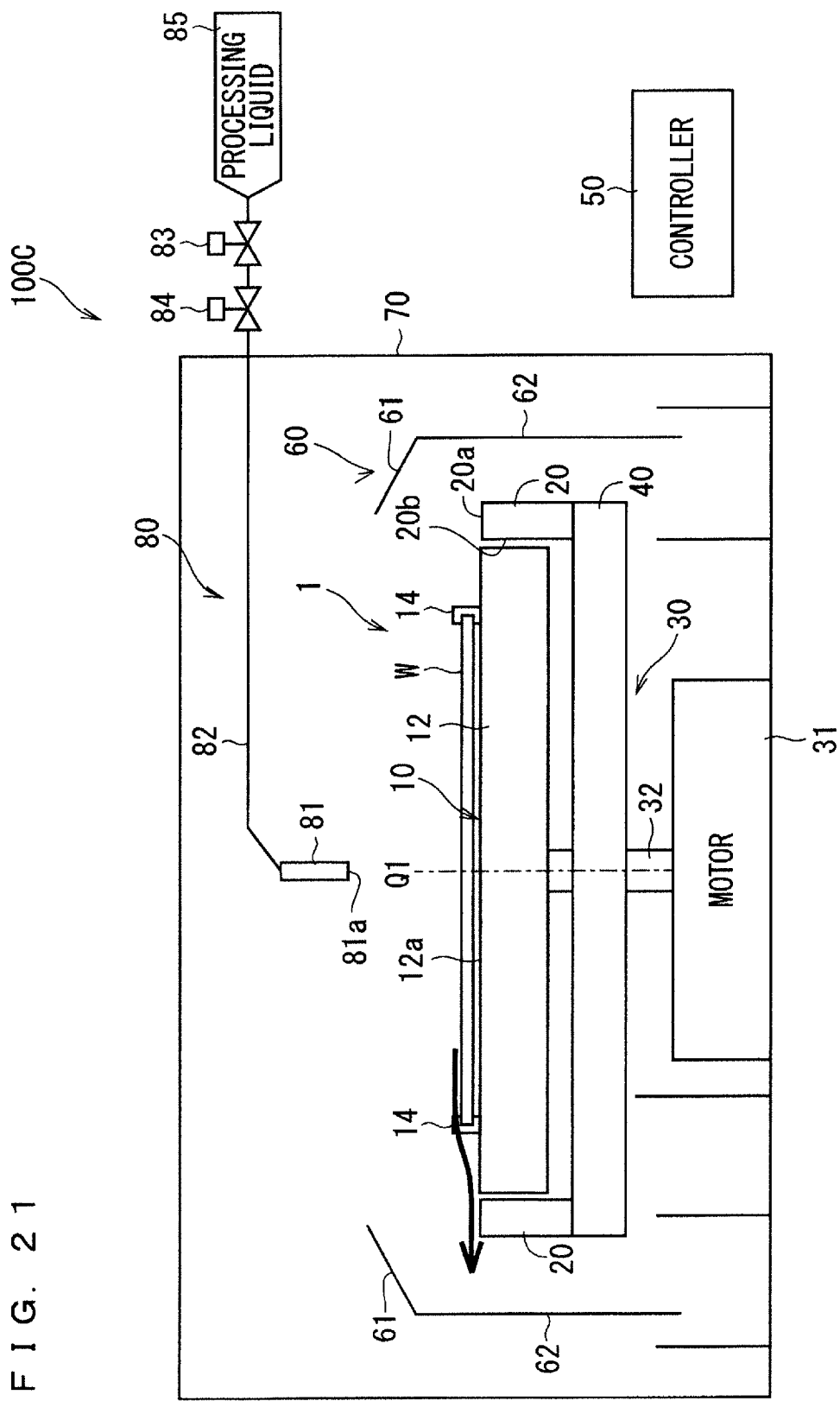
FIG. 21 is a view schematically showing an example of the configuration of the substrate processing apparatus.

FIG. 21 is a view schematically showing an example of the configuration of a substrate processing apparatus 100C. The substrate processing apparatus 100C is identical in configuration with the substrate processing apparatus 100. In the substrate processing apparatus 100C, the upper surface 12a of the base member 12 extends outwardly from the peripheral edge of the substrate W as seen in plan view to the extent that the processing liquid flying off from the peripheral edge of the substrate W flows over the upper surface 12a of the base member 12 during the substrate processing. In other words, the diameter of the outer peripheral surface of the base member 12 is greater than that of the substrate W to the extent that the processing liquid flying off from the peripheral edge of the substrate W flows over the upper surface 12a of the base member 12.

The base member 12 rotates in synchronism with the substrate W during the substrate processing. Thus, the processing liquid flowing over the upper surface 12a of the base member 12 is subjected to centrifugal force resulting from the rotation of the base member 12 to spread, and then flies outwardly from the peripheral edge of the upper surface 12a of the base member 12.

In this case, the ring member 20 is disposed so that the upper surface 20a of the ring member 20 is level with or below the upper surface 12a of the base member 12. Specifically, the ring member 20 is disposed at a vertical position such that the processing liquid flying off from the peripheral edge of the upper surface 12a of the base member 12 flows over the upper surface 20a of the ring member 20.

In such a substrate processing apparatus 100C, the processing liquid flying off from the peripheral edge of the substrate W flows over the upper surface 12a of the base member 12 and the upper surface 20a of the ring member 20 in the order named. Because the processing liquid flows over the upper surface 20a of the ring member 20, the flow velocity of the processing liquid flying off from the outer peripheral edge of the ring member 20 is suitably controlled by the rotation of the ring member 20.

While the substrate holding apparatus and the substrate processing apparatus have been described hereinabove in detail, the foregoing description is in all aspects illustrative and not restricted thereto. The aforementioned various modifications are applicable in combination unless the modifications are inconsistent with each other. It is therefore understood that numerous other modifications not illustrated can be devised without departing from the scope of the present disclosure.

EXPLANATION OF REFERENCE SIGNS

1 Substrate holding apparatus
5 Selection part
10 Holding member
20 Ring member
22 Protective member
24 Elevating mechanism
30 Rotation mechanism
31 Motor
32 Shaft
40, 40A-40C Speed change mechanisms
41 External gear
42, 42A First gear parts (gear parts)
421 Second gear (external gear)
422, 422a, 422b First gears (external gears)
42B Second gear part (gear part)
43 Internal gear
45, 45A, 45B Movement mechanisms
50 Control means (controller)

80 First processing liquid supply means (processing liquid supply part)
90 Second processing liquid supply means (processing liquid supply part)
222 Second protrusions (protrusions)
431 First protrusions (protrusions)
W Substrate

The invention claimed is:

1. A substrate processing apparatus comprising:
a substrate holder; and
a tubular cup surrounding said substrate holder; wherein said substrate holder including:
a holder holding a substrate in a horizontal attitude, and having a base member which has a first upper surface opposed in spaced apart relation to a back surface of the substrate and pins which protrude from said first upper surface and arranged in spaced apart relation along a peripheral edge of said substrate;
a ring member in a shape of a ring surrounding the peripheral edge of the substrate held by said holder of the substrate holder as seen in plan view, said ring member located between said holder of the substrate holder and said cup, said ring member having a second upper surface positioned below a front surface of said substrate an inner peripheral surface extending vertically down below from an inner peripheral edge of said second upper surface, and an outer peripheral surface extending vertically down below from an outer peripheral edge of said second upper surface and opposed in spaced apart relation to an inner peripheral surface of said cup; and
a rotation mechanism including a motor, said rotation mechanism rotating said holder of the substrate holder and said ring member about a rotation axis at rotation speeds different from each other and/or in rotational directions different from each other, said rotation axis being a vertical axis passing through the substrate held by said holder of the substrate holder,
wherein, the second upper surface of said ring member is located below said front surface of said substrate and above the first upper surface of said base member, and
said ring member and said cup are spaced apart from each other.

2. The substrate processing apparatus according to claim 1, wherein
said rotation mechanism includes:
a shaft coupling said motor and said holder of the substrate holder to each other, and
a speed transmission coupling said shaft and said ring member rotatably relative to each other and rotating said ring member at a speed ratio to the rotation speed of said shaft.

3. The substrate processing apparatus according to claim 2, wherein
said speed transmission includes:
an external gear coupled to said shaft and rotating together with said shaft,
an internal gear coupled to said ring member, and
a first gear part including at least one first gear provided between said external gear and said internal gear and rotating said internal gear as said external gear rotates.

4. The substrate processing apparatus according to claim 3, wherein
said at least one first gear includes an even number of first gears, and
said even number of first gears mesh with each other in series and rotate said internal gear as said external gear rotates.

5. The substrate processing apparatus according to claim 3, wherein
said first gear part includes an odd number of first gears and rotates said internal gear as said external gear rotates.

6. The substrate processing apparatus according to claim 1, wherein
said rotation mechanism includes:
a first motor rotating said holder of the substrate holder; and
a second motor rotating said ring member.

7. The substrate processing apparatus according to claim 1, wherein
said rotation mechanism rotates said ring member at a variable speed ratio to the rotation speed of said holder of the substrate holder.

8. The substrate processing apparatus according to claim 7, wherein:
said rotation mechanism rotates said ring member at a first ring speed when rotating said holder of the substrate holder at a first holding speed;
said rotation mechanism rotates said ring member at a second ring speed when rotating said holder of the substrate holder at a second holding speed lower than said first holding speed; and
a first speed ratio of said first ring speed to said first holding speed is lower than a second speed ratio of said second ring speed to said second holding speed.

9. The substrate processing apparatus according to claim 1, wherein
said second upper surface of said ring member is inclined with respect to a horizontal plane so that said outer peripheral edge of said second upper surface is positioned below said inner peripheral edge of said second upper surface.

10. The substrate processing apparatus according to claim 1, wherein
said second upper surface of said ring member has a hydrophilicity.

11. The substrate processing apparatus according to claim 1, wherein
at least one of said inner peripheral surface of said ring member and an outer peripheral surface of said holder of the substrate holder opposed to said inner peripheral surface of said ring member has a hydrophobicity.

12. The substrate processing apparatus according to claim 11, wherein
said inner peripheral surface of said ring member has a hydrophobicity.

13. The substrate processing apparatus according to claim 1, further comprising
an elevator moving said ring member upwardly and downwardly relative to said holder of the substrate holder.

14. The substrate processing apparatus according to claim 1, further comprising:
a processing liquid supply unit including a nozzle supplying a processing liquid to said front surface of said substrate held by said holder of the substrate holder; and
a controller configured to cause said processing liquid supply unit to supply the processing liquid while causing said rotation mechanism to rotate said holder of the substrate holder and said ring member, thereby performing substrate processing,
wherein the first upper surface of said holder of the substrate holder extends outwardly from the peripheral edge of the substrate as seen in plan view, and
wherein the processing liquid flying off from the peripheral edge of the substrate flows over the second upper surface of said ring member in said substrate processing.

15. A substrate processing apparatus comprising:
a substrate holder; and
a tubular cup surrounding said substrate holder; wherein said substrate holder including:
a holder holding a substrate in a horizontal attitude;
a ring member in a shape of a ring surrounding a peripheral edge of the substrate held by said holder of the substrate holder as seen in plan view, said ring member located between said holder of the substrate holder and said cup, said ring member having an upper surface level with or positioned below a front surface of said substrate, an inner peripheral surface extending vertically down below from an inner peripheral edge of said upper surface, and an outer peripheral surface extending vertically down below from an outer peripheral edge of said upper surface and opposed in spaced apart relation to an inner peripheral surface of said cup; and
a rotation mechanism including a motor, said rotation mechanism rotating said holder of the substrate holder and said ring member about a rotation axis at rotation speeds different from each other and/or in rotational directions different from each other, said rotation axis being a vertical axis passing through the substrate held by said holder of the substrate holder, wherein
said rotation mechanism includes:
a shaft coupling said motor and said holder of the substrate holder to each other, and
a speed transmission coupling said shaft and said ring member rotatably relative to each other and rotating said ring member at a speed ratio to the rotation speed of said shaft,
said speed transmission includes:
an external gear coupled to said shaft and rotating together with said shaft,
an internal gear coupled to said ring member, and
a first gear part including at least one first gear provided between said external gear and said internal gear and rotating said internal gear as said external gear rotates,
said at least one first gear includes an even number of first gears, and
said even number of first gears mesh with each other in series and rotate said internal gear as said external gear rotates,
said speed transmission includes:
a second gear part provided between said external gear and said internal gear and having an odd number of second gears meshing with each other in series, said second gear part rotating said internal gear as said external gear rotates; and
a mover for moving said first gear part between a first meshing position in which said first gear part is positioned between said external gear and said internal gear and a first retracted position in which said first gear part is retracted from between said external gear and said internal gear, and moving said second gear part between a second meshing position in which said second gear part is positioned between said external gear and said internal gear and a second retracted position in which said second gear part is retracted from between said external gear and said internal gear.

16. A substrate processing apparatus comprising:
a substrate holder; and
a tubular cup surrounding said substrate holder; wherein said substrate holder including:
a holder holding a substrate in a horizontal attitude;
a ring member in a shape of a ring surrounding a peripheral edge of the substrate held by said holder of the substrate holder as seen in plan view, said ring member located between said holder of the substrate holder and said cup, said ring member having an upper surface level with or positioned below a front surface of said substrate, an inner peripheral surface extending vertically down below from an inner peripheral edge of said upper surface, and an outer peripheral surface extending vertically down below from an outer peripheral edge of said upper surface and opposed in spaced apart relation to an inner peripheral surface of said cup;
a rotation mechanism including a motor, said rotation mechanism rotating said holder of the substrate holder and said ring member about a rotation axis at rotation speeds different from each other and/or in rotational directions different from each other, said rotation axis being a vertical axis passing through the substrate held by said holder of the substrate holder,
an elevator moving said ring member upwardly and downwardly relative to said holder of the substrate holder,
a first processing liquid supply unit including a nozzle supplying a processing liquid to a front surface of a substrate held by said holder of the substrate holder;
a second processing liquid supply unit including a nozzle supplying a processing liquid to a back surface of the substrate held by said holder of the substrate holder; and
a controller configured to (i) control said elevator to stop said ring member at a first position lying below the front surface of said substrate and causing said first processing liquid supply unit to supply the processing liquid while causing said rotation mechanism to rotate said holder of the substrate holder and said ring member, and (ii) control said elevator to stop said ring member at a second position a distance equal to the thickness of said substrate below said first position and causing said second processing liquid supply unit to supply the processing liquid while causing said rotation mechanism to rotate said holder of the substrate holder and said ring member.

* * * * *